United States Patent
Jun

(10) Patent No.: US 9,966,401 B2
(45) Date of Patent: May 8, 2018

(54) PACKAGE FOR IMAGE SENSOR WITH OUTER AND INNER FRAMES

(71) Applicant: Samsung Electronics Co., Ltd., Suwon-si, Gyeonggi-do (KR)

(72) Inventor: Hyunsu Jun, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 15/049,002

(22) Filed: Feb. 19, 2016

(65) Prior Publication Data

US 2016/0260761 A1 Sep. 8, 2016

(30) Foreign Application Priority Data

Mar. 4, 2015 (KR) .................. 10-2015-0030508

(51) Int. Cl.
*H01L 27/146* (2006.01)

(52) U.S. Cl.
CPC .. *H01L 27/14618* (2013.01); *H01L 27/14636* (2013.01); *H01L 2224/05554* (2013.01); *H01L 2224/32225* (2013.01); *H01L 2224/48227* (2013.01); *H01L 2224/49171* (2013.01); *H01L 2224/73265* (2013.01); *H01L 2224/97* (2013.01); *H01L 2924/15311* (2013.01)

(58) Field of Classification Search
CPC .................. H01L 27/14618; H01L 27/14636
See application file for complete search history.

(56) References Cited

U.S. PATENT DOCUMENTS

| | | |
|---|---|---|
| 7,138,695 B2 | 11/2006 | Kim et al. |
| 7,279,782 B2 | 10/2007 | Yang et al. |
| 7,511,374 B2 | 3/2009 | Derderian et al. |
| 7,745,897 B2 | 6/2010 | Tan et al. |
| 8,093,674 B2 | 1/2012 | Tu et al. |
| 8,269,300 B2 | 9/2012 | Chien et al. |
| 8,390,087 B2 | 3/2013 | Tu et al. |
| 2002/0171031 A1 | 11/2002 | Kim et al. |
| 2006/0098244 A1 | 5/2006 | Choi et al. |
| 2006/0145325 A1 | 7/2006 | Yang et al. |
| 2006/0223207 A1 | 10/2006 | Derderian et al. |
| 2006/0268144 A1 | 11/2006 | Tan et al. |
| 2007/0287216 A1* | 12/2007 | Derderian ......... H01L 27/14618 438/67 |
| 2009/0045476 A1 | 2/2009 | Peng et al. |
| 2009/0224344 A1 | 9/2009 | Huang et al. |
| 2009/0256222 A1 | 10/2009 | Hsu |

(Continued)

FOREIGN PATENT DOCUMENTS

| | | |
|---|---|---|
| JP | 2009170585 A | 7/2009 |
| KR | 20100054390 | 5/2010 |
| KR | 101159807 B1 | 6/2012 |

*Primary Examiner* — Peter Bradford
(74) *Attorney, Agent, or Firm* — Renaissance IP Law Group LLP

(57) ABSTRACT

A semiconductor package according to the inventive concepts includes an image sensor chip mounted on a substrate, a first holder disposed on an edge area of the image sensor chip, a second holder disposed laterally spaced apart from the image sensor chip on an edge area of the substrate, a molding part provided in a gap region between the first holder and the second holder on the substrate, and a transparent cover disposed on the first holder and the molding part.

20 Claims, 37 Drawing Sheets

(56) References Cited

U.S. PATENT DOCUMENTS

| | | |
|---|---|---|
| 2009/0267170 A1 | 10/2009 | Chien et al. |
| 2011/0024861 A1 | 2/2011 | Tu et al. |
| 2011/0024862 A1 | 2/2011 | Tu et al. |
| 2012/0249822 A1* | 10/2012 | Yoshida ............ H01L 27/14618 348/222.1 |
| 2013/0149805 A1 | 6/2013 | Chuang et al. |
| 2013/0264703 A1* | 10/2013 | Tae .................. H01L 23/49811 257/737 |
| 2014/0264699 A1* | 9/2014 | Ryu .................. H01L 27/14618 257/434 |
| 2016/0005778 A1* | 1/2016 | Jun .................. H01L 27/14618 257/432 |
| 2016/0148879 A1* | 5/2016 | Saxod ................. H01L 23/562 257/684 |
| 2016/0241749 A1* | 8/2016 | Alasimio ............ H04N 5/2257 |

\* cited by examiner

PACKAGE FOR IMAGE SENSOR WITH OUTER AND INNER FRAMES

CROSS-REFERENCE TO RELATED APPLICATION

This U.S. non-provisional patent application claims priority under 35 U.S.C. § 119 to Korean Patent Application No. 10-2015-0030508, filed on Mar. 4, 2015, in the Korean Intellectual Property Office, the disclosure of which is hereby incorporated by reference in its entirety.

BACKGROUND

The inventive concepts relate to a semiconductor package and a method for manufacturing the same. More particularly, the inventive concepts relate to a semiconductor package including an image sensor chip and a method for manufacturing the same.

Generally, an image sensor is a device that converts one or more-dimensional optical information into electrical signals. Image sensors may be categorized as any one of complementary metal-oxide-semiconductor (CMOS)-type image sensors and charge coupled device (CCD)-type image sensors. Image sensors are increasingly used as they are applied to various fields such as a camera, camcorder, a multimedia personal computer, and/or a security camera.

SUMMARY

Embodiments of the inventive concepts may provide a semiconductor package sealed in good condition and a method for manufacturing the same.

In one aspect, a semiconductor package may include a substrate, an image sensor chip mounted on the substrate, a first holder disposed on an edge area of the image sensor chip, a second holder disposed laterally spaced apart from the image sensor chip on an edge area of the substrate, a molding part provided in a gap region between the first holder and the second holder on the substrate, and a transparent cover disposed on the first holder and the molding part. The second holder may include the same material as the first holder.

In an embodiment, the semiconductor package may further include a connection holder connecting the first holder to the second holder on the substrate. The connection holder may include the same material as the first and second holders.

In an embodiment, the connection holder may extend in a direction diagonal to a sidewall of the image sensor chip and may connect a corner of the first holder to a corner of the second holder.

In an embodiment, the semiconductor package may further include bonding wires disposed on the substrate to electrically connect the image sensor chip to the substrate. The bonding wires may be laterally spaced apart from the connection holder.

In an embodiment, the semiconductor package may further include an adhesion part disposed between a top surface of the first holder and a bottom surface of the transparent cover and between a top surface of the molding part and the bottom surface of the transparent cover.

In an embodiment, the adhesion part may include a different material from the molding part.

In an embodiment, a top surface of the molding part may be disposed at the same level as or a lower level than a top surface of the first holder, and a top surface of the adhesion part disposed on the molding part may be disposed at the substantially same level as a top surface of the adhesion part disposed on the first holder.

In an embodiment, the transparent cover may cover a top surface of the second holder.

In an embodiment, the transparent cover may be disposed on an inner sidewall of the second holder, and a top surface of the transparent cover may be disposed at the same level as or a higher level than a top surface of the second holder.

In another aspect, a semiconductor package may include a substrate, an image sensor chip mounted on the substrate, a holder provided on the substrate, the holder including a first holder, a second holder, and a connection holder, the first holder disposed on the image sensor chip, the second holder laterally spaced apart from the image sensor chip and disposed on the substrate, and the connection holder connecting the first holder to the second holder, a molding part filling a gap region between the first and second holders on the substrate, and a transparent cover disposed on the first holder and the molding part. The connection holder of the holder may include the same material as the first holder and the second holder.

In an embodiment, the semiconductor package may further include bonding wires electrically connecting the image sensor chip to the substrate on the substrate. The bonding wires may not overlap with the connection holder when viewed from a plan view.

In an embodiment, the semiconductor package may further include an adhesion part disposed between the holder and the transparent cover and the molding part and the transparent cover. The adhesion part may include a photo-curable polymer or a photo/heat dual curable polymer, and the molding part may include a thermosetting polymer.

In an embodiment, a top surface of the molding part may be disposed at a lower level than a top surface of the holder, and a top surface of the adhesion part disposed on the molding part may be disposed at the substantially same level as a top surface of the adhesion part disposed on the first holder of the holder.

In an embodiment, a top surface of the second holder may be disposed at a higher level than a top surface of the first holder and may be disposed at the same level as or a lower level than a top surface of the transparent cover.

In an embodiment, the semiconductor package may further include a first adhesive film disposed between the first holder and the image sensor chip, and a second adhesive film disposed between the second holder and the substrate.

In still another aspect, a semiconductor package is provided. The semiconductor package may comprise a substrate; an image sensor chip mounted on the substrate; a first holder disposed on an edge area of the image sensor chip to surround micro-lenses; a second holder spaced apart from the image sensor chip and disposed on an edge area of the substrate to surround the image sensor chip; a molding part disposed in a gap region between the first holder and the second holder on the substrate; an adhesion part disposed on the first holder and the molding part; and a transparent cover disposed on the adhesive part to form an air gap defined by a bottom surface of the transparent cover, side walls of the first holder and a top surface of the image sensor chip. The air gap may be sealed by the adhesive part.

In an embodiment, a top surface of the adhesive part disposed on the first holder and a top surface of the adhesive part disposed on the molding part may be at a substantially same level.

In an embodiment, a top surface of the transparent cover may be disposed at a level that may be substantially the same as a level of a top surface of the second holder or at a level that may be different from a level of a top of the second holder; and the adhesion part may be further disposed between a portion of side walls of the second holder and a sidewall of the transparent cover.

In an embodiment, the adhesion part may be further disposed on the second holder, and a top surface of the first holder and a top surface of the second holder may be disposed at a substantially same level.

In an embodiment, the semiconductor package may comprise a connection holder to connect the first holder and the second holder, wherein the connection holder extends in a direction diagonal to a sidewall of the image sensor chip and connects a corner of the first holder to a corner of the second holder, wherein the connection holder covers a sidewall of the image sensor chip and a portion of a top surface of the image sensor chip adjacent to the sidewall.

In still another aspect, a holder is provided for a semiconductor package. The holder comprises a first holder configured to be disposed on an edge area of an image sensor chip to surround micro-lenses of the image sensor chip mounted on a substrate; a second holder configured to be spaced apart from the image sensor chip and disposed on an edge area of the substrate to surround the image sensor chip; and a connection holder connecting the first holder to the second holder.

In an embodiment, the first holder, the second holder, and the connection holder include the same material In still another aspect, a method for manufacturing a semiconductor package may include mounting an image sensor chip on a substrate, disposing a holder on a substrate, the holder including a first holder disposed on the image sensor chip, a second holder laterally spaced apart from the image sensor, and a connection holder connected to the first and second holders, forming a molding part between the first and second holders on the substrate, and bonding a transparent cover onto the holder and the molding part. The connection holder may include the same material as the first holder and the second holder.

In an embodiment, the first holder, the second holder, and the connection holder may be disposed on the substrate at the same time.

In an embodiment, the substrate may include a plurality of unit substrates laterally disposed. Mounting the image sensor chip may include preparing a plurality of the image sensor chips, and mounting the image sensor chips on the unit substrates, respectively.

In an embodiment, disposing the holder may include providing a holder frame including a plurality of unit holder parts connected to each other, and disposing the unit holder parts of the holder frame on the unit substrates, respectively. Each of the unit holder parts may include the first holder, the second holder, and the connection holder.

In an embodiment, bonding the transparent cover may include forming an adhesion part on the molding part and the holder, disposing the transparent cover on the adhesion part, and hardening the adhesion part by irradiating ultraviolet rays to the adhesion part. Hardening the adhesion part may be performed after disposing the transparent cover.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
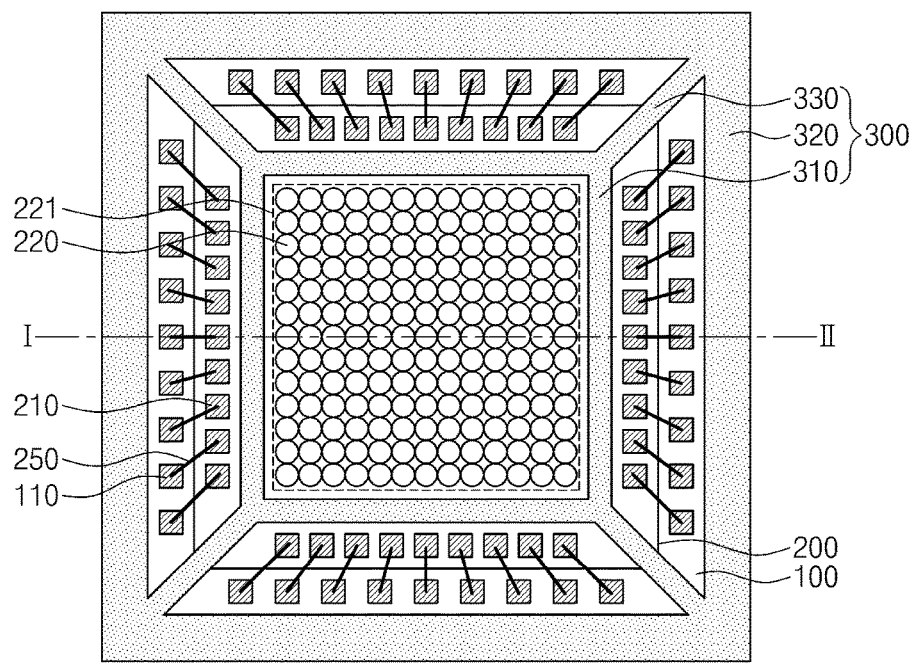
FIG. 1A is a plan view illustrating a semiconductor package according to an embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

[Embodiments of Semiconductor Package]

A semiconductor package according to an embodiment and a method for manufacturing the same will be described hereinafter.

Figure 1B:
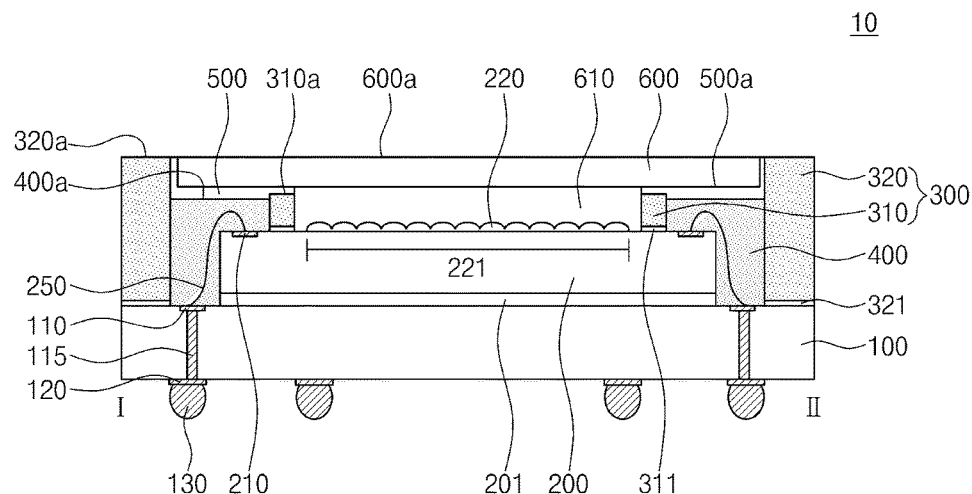
FIG. 1B is a cross-sectional view taken along a line I-II of FIG. 1A.

FIG. 1A is a plan view illustrating a semiconductor package according to an embodiment of the inventive concepts. FIG. 1B is a cross-sectional view taken along a line I-II of FIG. 1A.

Referring to FIGS. 1A and 1B, a semiconductor package 10 may include a unit substrate 100, an image sensor chip 200, a holder 300, a molding part 400, an adhesion part 500, and a transparent cover 600. An air gap 610 may be provided between the image sensor chip 200 and the transparent cover 600.

The unit substrate 100 may be a printed circuit board (PCB) having a circuit pattern. The unit substrate 100 may include internal pads 110, through-vias 115, and/or external pads 120. The internal pads 110 may be provided on a top surface of the unit substrate 100. The through-vias 115 may penetrate the unit substrate 100 and may be electrically connected to the internal pads 110. The external pads 120 may be disposed on a bottom surface of the unit substrate 100 and may be electrically connected to the through-vias 115. Connecting terminals 130 may be disposed on the external pads 120. The internal pads 110, and the through-vias 115, the external pads 120, and the connecting terminals 130 may include conductive materials.

The image sensor chip 200 may be mounted on the unit substrate 100. The image sensor chip 200 may sense a subject and may generate an electrical signal corresponding to the sensed subject. As illustrated in FIG. 1A, micro-lenses 220 may be provided on a pixel area 221 of the image sensor chip 200. The pixel area 221 of the image sensor chip 200 may be provided in a core area of the image sensor chip 200 when viewed from a plan view. Connection pads 210 may be provided on an edge area of a top surface of the image sensor chip 200. Even though not shown in the drawings, the edge area of the image sensor chip 200 may include circuit patterns. As illustrated in FIG. 1B, an adhesive layer 201 may be disposed between the unit substrate 100 and the image sensor chip 200 to bond the image sensor chip 200 to the unit substrate 100. The adhesive layer 201 may include a thermosetting polymer, e.g., an epoxy-based polymer.

Bonding wires 250 may be in contact with the internal pads 110 and the connection pads 210, respectively. The bonding wires 250 may be adjacent to sidewalls of the image sensor chip 200. The image sensor chip 200 may be electrically connected to the unit substrate 100 through the bonding wires 250. The bonding wires 250 may include a conductive material, e.g., gold (Au), aluminum (Al), copper (Cu), and/or any alloy thereof.

The holder 300 may be provided on the unit substrate 100 and may support the transparent cover 600. As illustrated in FIG. 1A, the holder 300 may include a first holder 310, a second holder 320, and a connection holder 330. The first holder 310 may be disposed on an edge area of the image sensor chip 200 to surround the micro-lenses 220. The second holder 320 may be disposed on an edge area of the unit substrate 100. The second holder 320 may be provided to surround the image sensor chip 200. The second holder 320 may not overlap with the image sensor chip 200. The connection holder 330 may be disposed between the first holder 310 and the second holder 320 and may connect the first holder 310 to the second holder 320. In an embodiment, the connection holder 330 may connect a corner of the first holder 310 to a corner of the second holder 320 and may extend in a direction diagonal to the sidewall of the image sensor chip 200. The connection holder 330 may intersect a corner area of the image sensor chip 200. In the present specification, the term 'a corner' may mean a portion at which planes meet each other. The bonding wires 250 may not be disposed on the corner area of the image sensor chip 200, and thus, the connection holder 330 may not overlap with the bonding wires 250. In some embodiments, the first holder 310, the second holder 320, and the connection holder 330 may constitute a holder having one united body or an integral body. For example, the first holder 310, the second holder 320, and the connection holder 330 may include the same material.

As illustrated in FIG. 1B, the first holder 310 may be disposed on the image sensor chip 200. The first holder 310 may be disposed between the connection pads 210 and the micro-lenses 220. The connection pads 210 and the micro-lenses 220 may be exposed by the first holder 310. The first holder 310 may include an engineering plastic, for example, polyamide (PA), polycarbonate (PC), a liquid crystal polymer (LCP), or any combination thereof. A first adhesive film 311 may be disposed between the first holder 310 and the image sensor chip 200 to adhere the first holder 310 to the image sensor chip 200.

The second holder 320 may be disposed on the unit substrate 100 and may be spaced apart or laterally spaced apart from the image sensor chip 200, the first holder 310, and the internal pads 110. A second adhesive film 321 may be disposed between the second holder 320 and the unit substrate 100 to fix the second holder 320 on the unit substrate 100. A top surface 320a of the second holder 320 may be higher than a top surface 310a of the first holder 310.

The molding part 400 may be provided on the unit substrate 100 to fill a gap region between the first holder 310 and the second holder 320. The molding part 400 may cover the bonding wires 250 to protect the bonding wires 250. A top surface 400a of the molding part 400 may be disposed at the same level or a lower level than the top surface 310a of the first holder 310. The molding part 400 may include a thermosetting polymer, e.g., an epoxy-based polymer. The molding part 400 may have excellent adhesive characteristics, and thus, the molding part 400 may seal the gap region between the first and second holders 310 and 320 in a good condition.

The transparent cover 600 may be disposed on the top surface 310a of the first holder 310 and the top surface 400a of the molding part 400. The transparent cover 600 may be spaced apart from the image sensor chip 200 and may face the image sensor chip 200. The transparent cover 600 may include a transparent material (e.g., glass) and may transmit light. A top surface 600a of the transparent cover 600 may be disposed at the substantially same level as the top surface 320a of the second holder 320. The air gap 610 may be formed and defined by an inner sidewall of the first holder 310, a bottom surface of the transparent cover 600 and a top surface of the image sensor chip 200.

The adhesion part 500 may be disposed between the holder 300 and the transparent cover 600 and between the molding part 400 and the transparent cover 600. In some embodiments, the adhesion part 500 may cover the top surface 310a of the first holder 310, the top surface 400a of the molding part 400, and an inner sidewall of the second holder 320. The transparent cover 600, the holder 300, and the molding part 400 may be sealed by the adhesion part 500. In other words, the air gap 610 may be sealed by the adhesion part 500. The adhesion part 500 may include a different material from the molding part 400. The adhesion part 500 may include a photo-curable polymer or a photo/heat dual curable polymer. For example, the adhesion part 500 may include an epoxy-based polymer.

If the transparent cover 600 is not sealed in bad condition appropriately, the image sensor chip 200 may be exposed to external air and may be damaged. However, according to the embodiments of the inventive concepts, the adhesion part 500 disposed on the first holder 310 and the molding part 400 may have a relatively flat top surface 500a. For example, the top surface 500a of the adhesion part 500 on the first holder 310 may be disposed at the substantially same level as the top surface 500a of the adhesion part 500 on the molding part 400. Thus, the transparent cover 600 may be bonded to the first holder 310 and the molding part 400 in good condition, so that the air gap 610 may be sealed in good condition. As the adhesion part 500 may extend into a space between the inner sidewall of the second holder 320 and sidewalls of the transparent cover 600, a contact area between the transparent cover 600 and the adhesion part 500 may be increased. As a result, the transparent cover 600 and the second holder 320 may be sealed in good condition.

According to embodiments of the inventive concepts, the first holder 310 may be disposed on the image sensor chip 200 and positioned inside the second holder. Thus, the air gap 610 may be partially defined by inner sidewalls of the first holder 310 and may have a relative small volume.

Figure 1C:
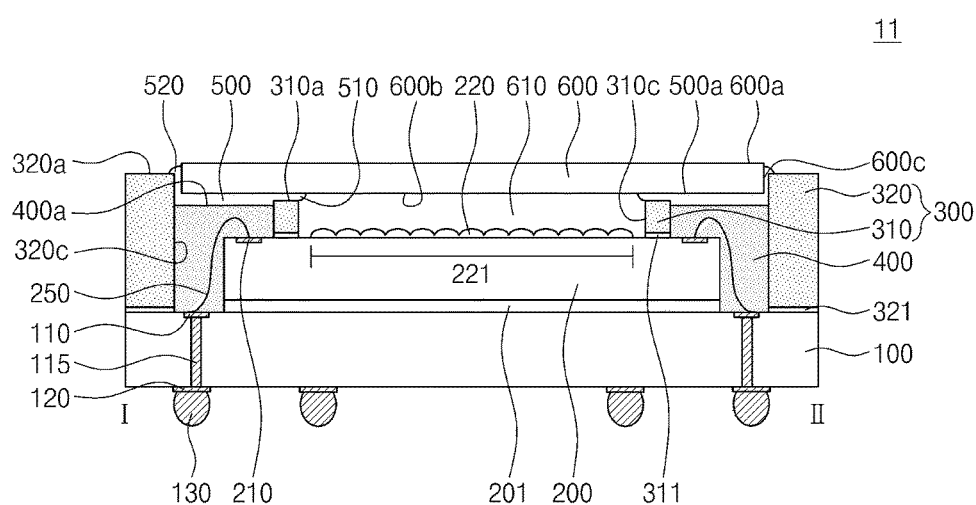
FIG. 1C is a cross-sectional view illustrating a semiconductor package according to an embodiment of the inventive concepts.

FIG. 1C is a cross-sectional view corresponding to the line I-II of FIG. 1A to illustrate a semiconductor package according to another embodiment of the inventive concepts. Hereinafter, the same descriptions as in the above embodiment will be omitted or mentioned briefly to avoid duplication of explanation.

Referring to FIGS. 1C and 1A, a semiconductor package 11 may include a unit substrate 100, an image sensor chip 200, bonding wires 250, a holder 300, a molding part 400, an adhesion part 500, and a transparent cover 600. An air gap 610 may be provided between the image sensor chip 200 and the transparent cover 600. The unit substrate 100, the image sensor chip 200, the bonding wires 250, and the first and second holders 310 and 320 of the holder 300 may be the same as described with reference to FIGS. 1A and 1B. Unlike FIGS. 1A and 1B, a top surface 600a of the transparent cover 600 may be disposed at a higher level than the top surface 320a of the second holder 320.

The adhesion part 500 may be disposed between the holder 300 and the transparent cover 600 and between the molding part 400 and the transparent cover 600. For example, the adhesion part 500 may cover the top surface 310a of the first holder 310, the top surface 400a of the molding part 400, and the inner sidewall of the second holder 320. The adhesion part 500 may include a first protrusion 510 and a second protrusion 520. The first protrusion 510 may extend from the adhesion part 500 between the first holder 310 and the transparent cover 600 to laterally protrude from the inner sidewall 310c of the first holder 310. The second protrusion 520 may extend from the adhesion part 500 between the molding part 400 and the transparent cover 600 to cover a sidewall 600c of the transparent cover 600 and the top surface 320a of the second holder 320. The adhesion part 500 may include the first and second protrusions 510 and 520, so the adhesion part 500 may further cover a bottom surface 600b and the sidewall 600c of the transparent cover 600. As a result, a contact area between the adhesion part 500 and the transparent cover 600 may be more increased to seal the semiconductor package 11 in better condition. In other embodiments, any one of the first and second protrusions 510 and 520 may be omitted.

While the first holder 310 and the second holder 320 are illustrated to have rectangular shape in plan view, the configuration of the first holder 310 and second holder 320 are not limited thereto. The first holder 310 and the second holder 320 may be any shape suitable for the configuration of the semiconductor package, the image sensor chip, and micro-lenses. For example, the first holder may have a circular shape or an oval shape depending on an area on which the micro-lenses are disposed.

In some embodiments, only one holder may be provided and the holder may be disposed on an edge area of the image sensor chip to surround micro-lenses. The transparent cover is disposed on a top surface of the molding part and a top surface the holder. Outer sidewalls of the substrate, the molding part and the transparent cover may be substantially aligned. In this embodiment, the size of the semiconductor package may be reduced.

FIGS. 2A to 4A are plan views illustrating a method for manufacturing a semiconductor package according to an embodiment of the inventive concepts. FIGS. 2B, 3B, 3C, 3D, and 4B are cross-sectional views illustrating a method for manufacturing a semiconductor package according to an embodiment of the inventive concepts. FIG. 2B is a cross-sectional view taken along a line III-IV of FIG. 2A, and FIGS. 3B, 3C, and 3D are cross-sectional views taken along a line III-IV of FIG. 3A. FIG. 4B is a cross-sectional view taken along a line III-IV of FIG. 4A. Hereinafter, the same descriptions as in the above embodiments will be omitted or mentioned briefly to avoid duplication of explanation.

Figure 2A:
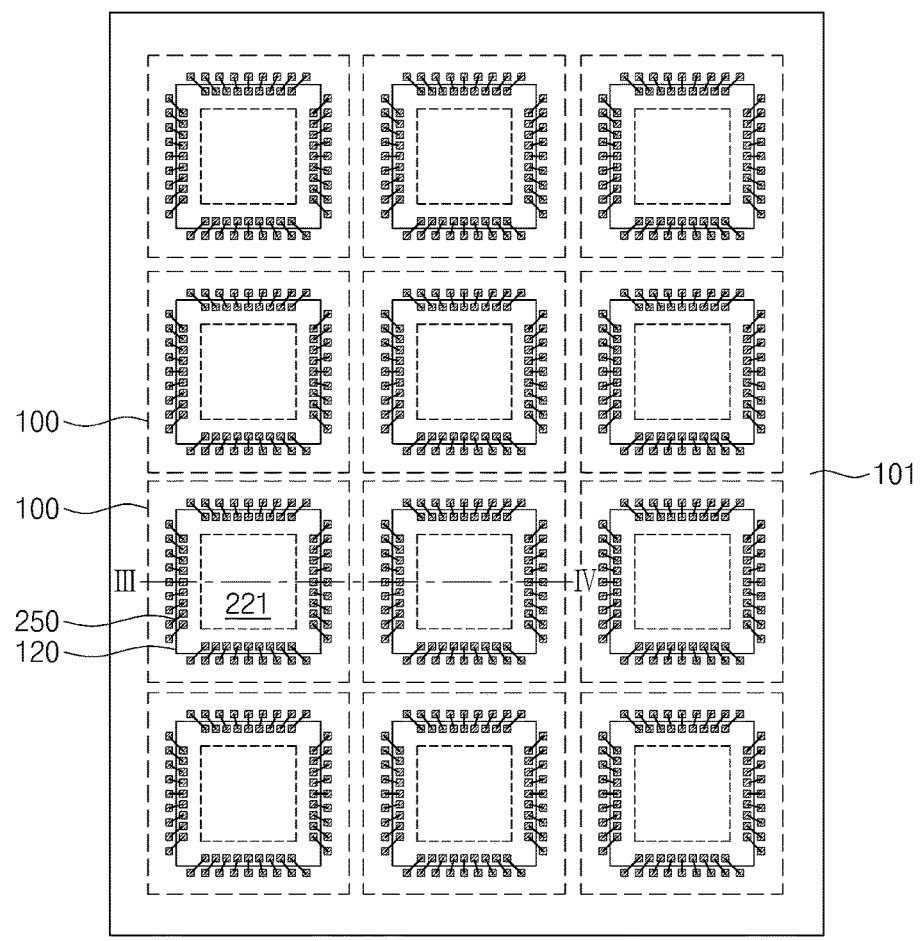
FIGS. 2A, 3A, and 4A are plan views illustrating a method for manufacturing a semiconductor package according to an embodiment of the inventive concepts.
Figure 2B:
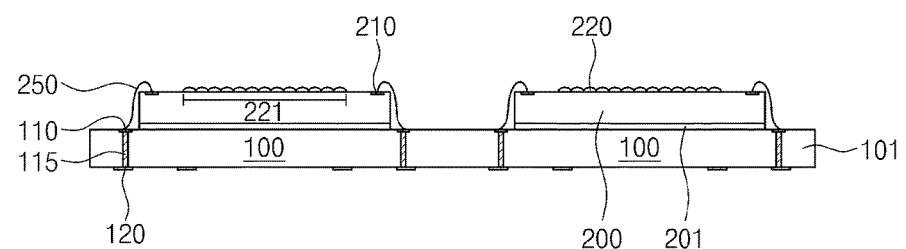
FIGS. 2B, 3B, 3C, 3D, and 4B are cross-sectional views illustrating a method for manufacturing a semiconductor package according to an embodiment of the inventive concepts.

Referring to FIGS. 2A and 2B, a substrate frame 101 including a plurality of unit substrates 100 may be provided. A sawing line may be provided on a bottom surface of the substrate frame 101 to define the unit substrates 100. In the substrate frame 101, the unit substrates 100 may be connected to each other and may be laterally arranged. Internal pads 110 may be disposed on a top surface of the substrate frame 101, and external pads 120 may be disposed on the bottom surface of the substrate frame 101. Through-vias 115 may penetrate the substrate frame 101 to connect the internal pads 110 to the external pads 120. Image sensor chips 200 may be mounted on the unit substrates 100, respectively. Each of the image sensor chips 200 may be mounted on each of the unit substrates 100 through bonding wires 250. The image sensor chips 200 and the bonding wires 250 may be the same as described with reference to FIGS. 1A and 1B.

Figure 3A:
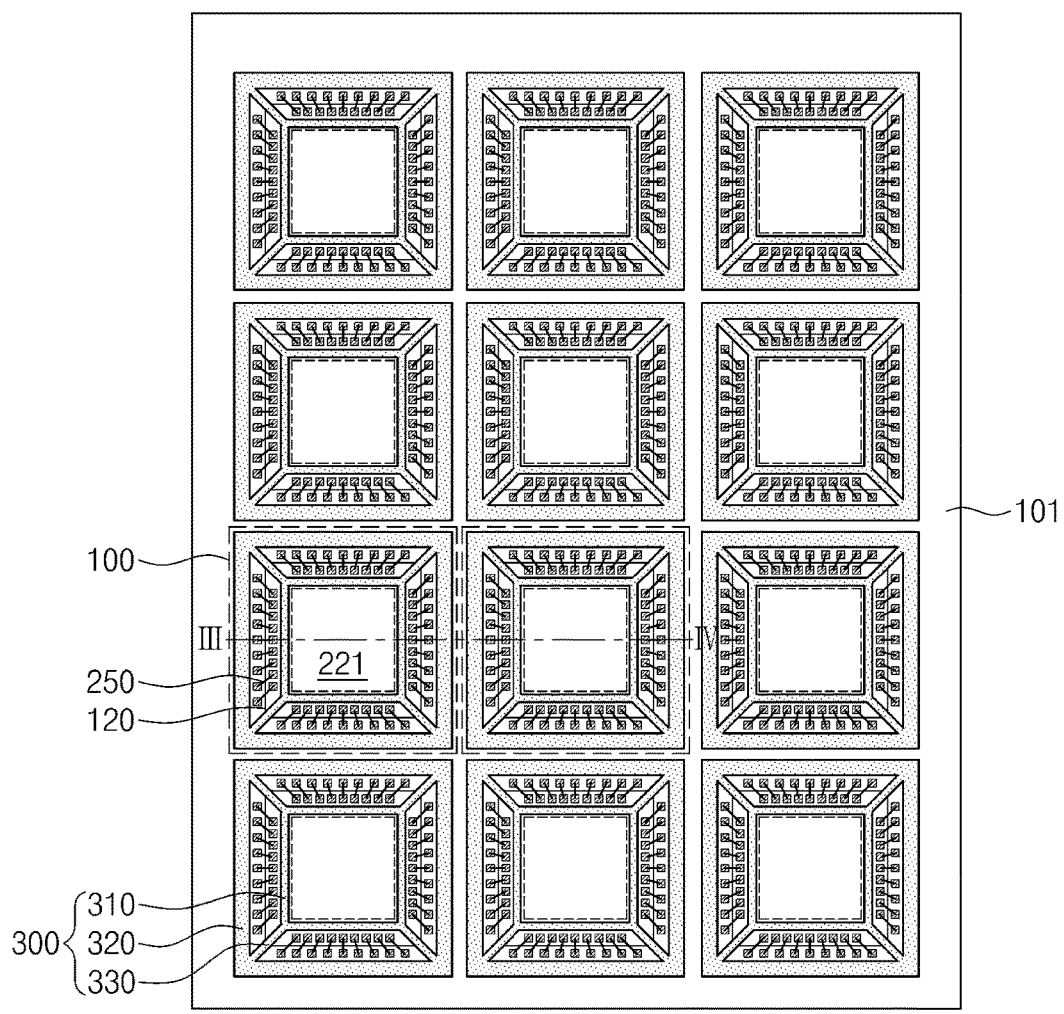
Figure 3B:
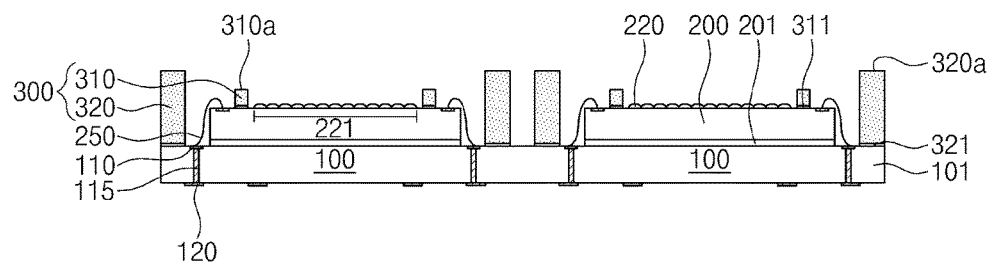

Referring to FIGS. 3A and 3B, holders 300 may be disposed on the unit substrates 100 of the substrate frame 101, respectively. Each of the holders 300 may be the same as described with reference to FIGS. 1A and 1B. For example, each of the holders 300 may include a first holder 310, a second holder 320, and a connection holder 330. Hereinafter, the holder 300 disposed on any one of the unit substrates 100 of FIG. 3B will be described. The connection holder 330 may connect the first and second holders 310 and 320 to each other, and thus, the first holder 310, the second holder 320, and the connection holder 330 may be disposed on the unit substrate 100 at the substantially same time. As illustrated in FIG. 3B, the first holder 310 may be laterally spaced apart from micro-lenses 220 on the image sensor chip 200. A first adhesive film 311 may be formed between the first holder 310 and the image sensor chip 200 to adhere the first holder 310 to the image sensor chip 200. The second holder 320 may be disposed on the unit substrate 100 and may be laterally spaced apart from the image sensor chip 200. At this time, a top surface 320a of the second holder 320 may be disposed at a higher level than a top surface 310a of the first holder 310. A second adhesive film 321 may be formed between the second holder 320 and the unit substrate 100 to adhere the second holder 320 to the unit substrate 100.

Figure 3C:
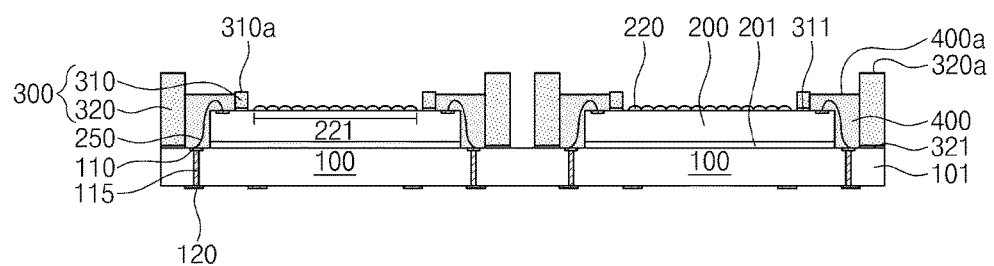

Referring to FIGS. 3C and 3A, molding parts 400 may be formed on the unit substrates 100 of the substrate frame 101, respectively. Each of the molding parts 400 may be provided in a gap region between the first holder 310 and the second holder 320 of each of the unit substrates 100. Forming the molding parts 400 may include providing a thermosetting polymer onto the unit substrates 100, and hardening the thermosetting polymer. Top surfaces 400a of the molding parts 400 may be disposed at the substantially same level as or a lower level than the top surfaces 310a of the first holders 310. Thus, the molding parts 400 may not flow onto the micro-lenses of the image sensor chips 200.

Figure 3D:
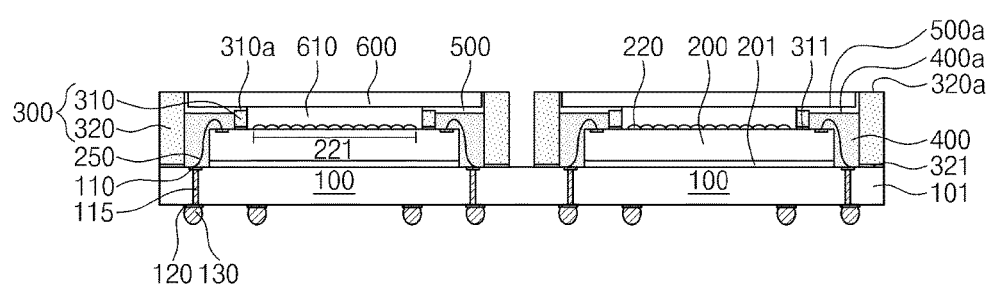

Referring to FIGS. 3D and 3A, adhesion parts 500 and transparent covers 600 may be provided on the unit substrates 100 of the substrate frame 101, respectively. For example, a photo-curable polymer may be applied to the top surfaces 400a of the molding parts 400 to form the adhesion parts 500. For example, the photo-curable polymer may be provided to edge portions at which the top surfaces 400a of the molding parts 400 meet inner sidewalls of the second holders 320. In another embodiment, the adhesion parts 500 may further extend onto the top surfaces 310a of the first holders 310.

The transparent covers 600 may be disposed on the first holders 310 and the molding parts 400, respectively. Height differences may occur between the top surfaces 310a of the first holders 310 and the top surfaces 400a of the molding parts 400. At this time, adhesion parts 500 may not be hardened, so the adhesion parts 500 may have fluidity. The height differences may be adjusted to be at the substantially the same level by superimposing the transparent covers 600 on the adhesion parts 500 due to the fluidity o the adhesion parts 50. Thus, the transparent covers 600 may be bonded well to the first holders 310 and the molding parts 400 by the adhesion parts 500. Air gaps 610 may be formed between the image sensor chips 200 and the transparent covers 600. After the transparent covers 600 are disposed, ultraviolet rays may be irradiated to the adhesion parts 500 to harden the adhesion parts 500. If the adhesion parts 500 are hardened by heat (e.g., a temperature of 80° C. or more), pressure in the air gaps 610 may ascend. Thus, air and/or moisture contained in the air gaps 610 may be expanded and then be exhausted. Since unhardened adhesion parts 500 have fluidity, the air and/or moisture may be exhausted together with the adhesion parts 500. However, according to embodiments of the inventive concepts, the adhesion parts 500 may be hardened by the irradiated ultraviolet rays. Thus, the process of hardening the adhesion parts 500 may be performed at a temperature of 60° C. or less. In another embodiment, the adhesion parts 500 may include photo/heat dual curable polymer. In this case, the process of hardening the adhesion parts 500 may include a first hardening process using irradiation of ultraviolet rays and a second hardening process using heat. Since the second hardening process is performed after the first hardening process, the adhesion parts 500 may not have fluidity during the second hardening process. Thus, the adhesion parts 500 may seal the transparent covers 600, the holders 300, and the molding part 400 in a good condition.

Connecting terminals 130 may be formed on the external pads 120. The time of the formation of the connecting terminals 130 may be various.

Figure 4A:
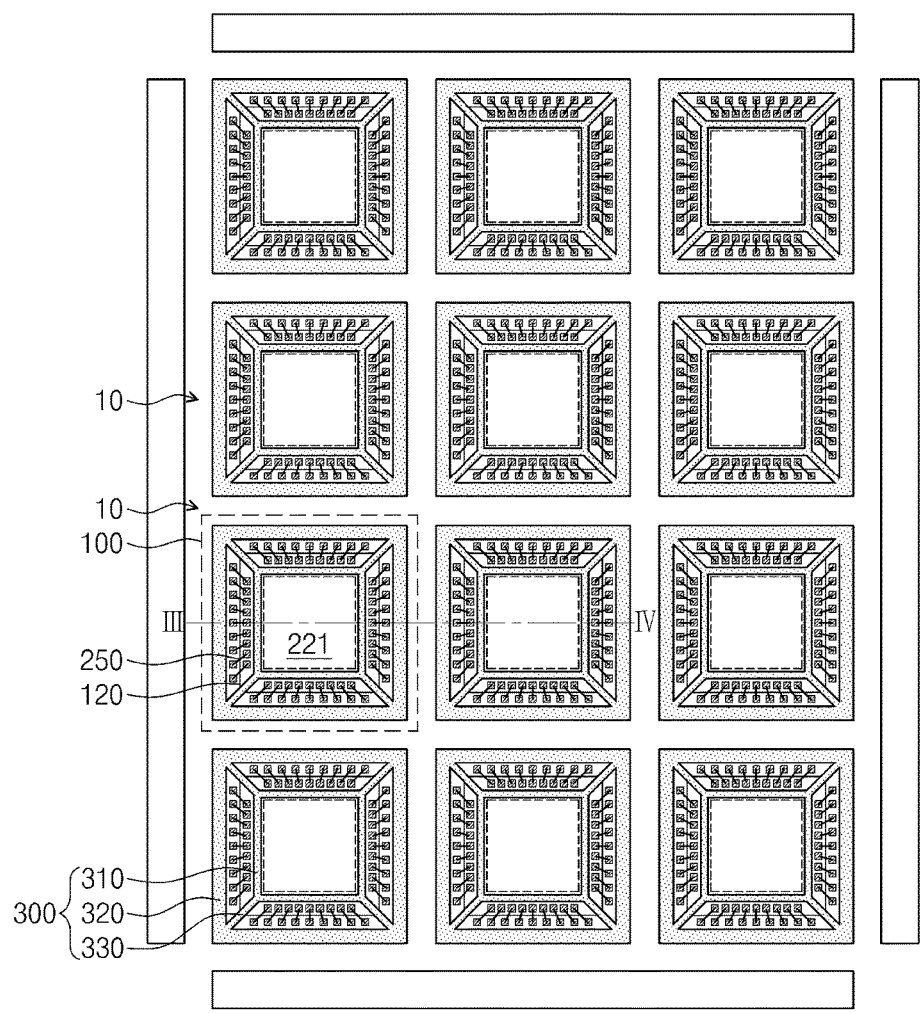
Figure 4B:
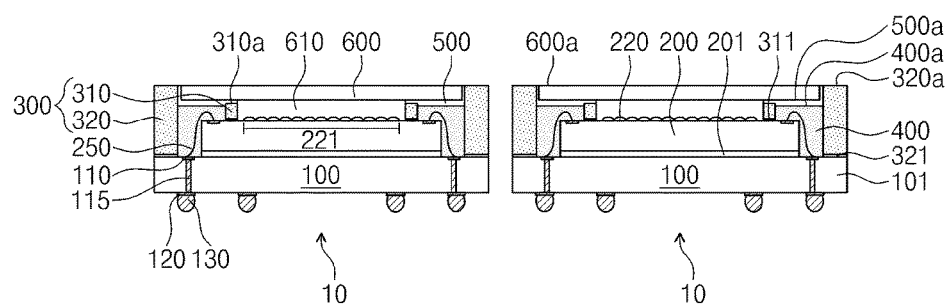

Referring to FIGS. 4A and 4B, the substrate frame 101 of FIGS. 3A and 3D may be sawed along its sawing lines to separate the unit substrates 100 from each other. A cleaning process may be performed on the transparent covers 600. If top surfaces 320a of the second holders 320 are disposed at a higher level than the top surfaces 600a of the transparent covers 600, impurities may remain in corner regions between inner sidewalls of the second holders 320 and the top surfaces 600a of the transparent covers 600 after the cleaning process. However, according to embodiments of the inventive concepts, the top surfaces 600a of the transparent covers 600 may be provided at the same level as or a higher level than the top surfaces 320a of the second holders 320. Thus, impurities on the top surfaces 600a of the transparent covers 600 may be easily removed. The semiconductor package 10 of FIGS. 1A and 1B may be completed by the manufacture embodiment described above.

Figure 5:
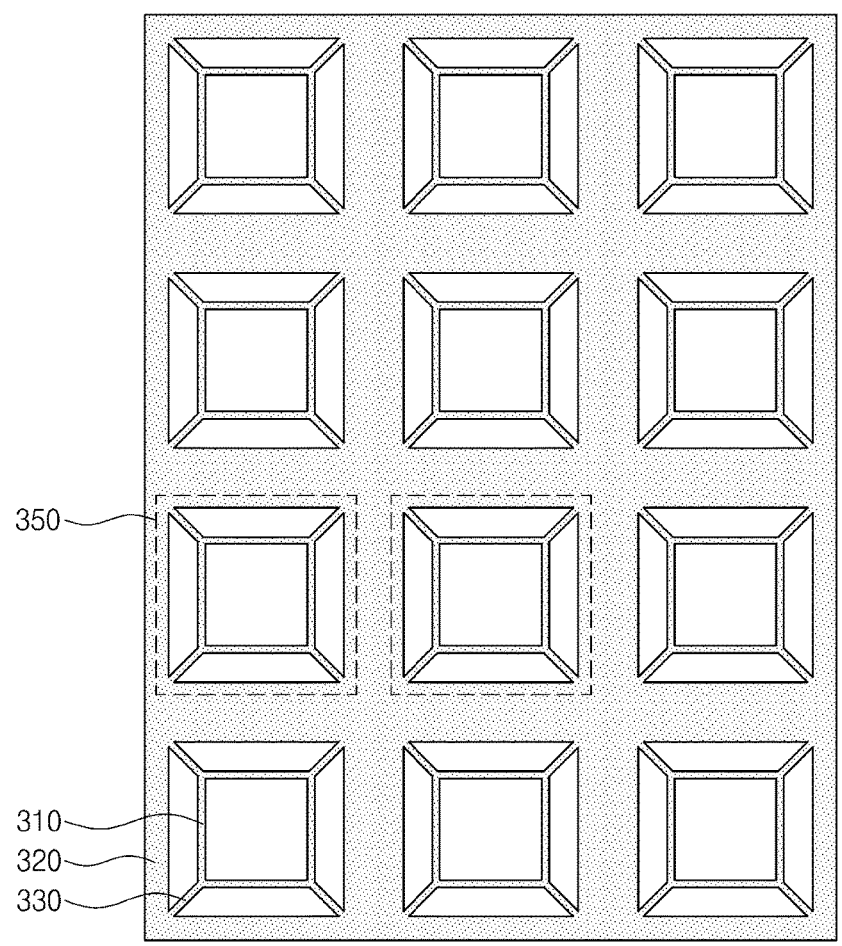
FIG. 5 is a plan view illustrating a holder frame according to an embodiment of the inventive concepts.

FIG. 5 is a plan view illustrating a holder frame according to an embodiment of the inventive concepts.

Figure 6A:
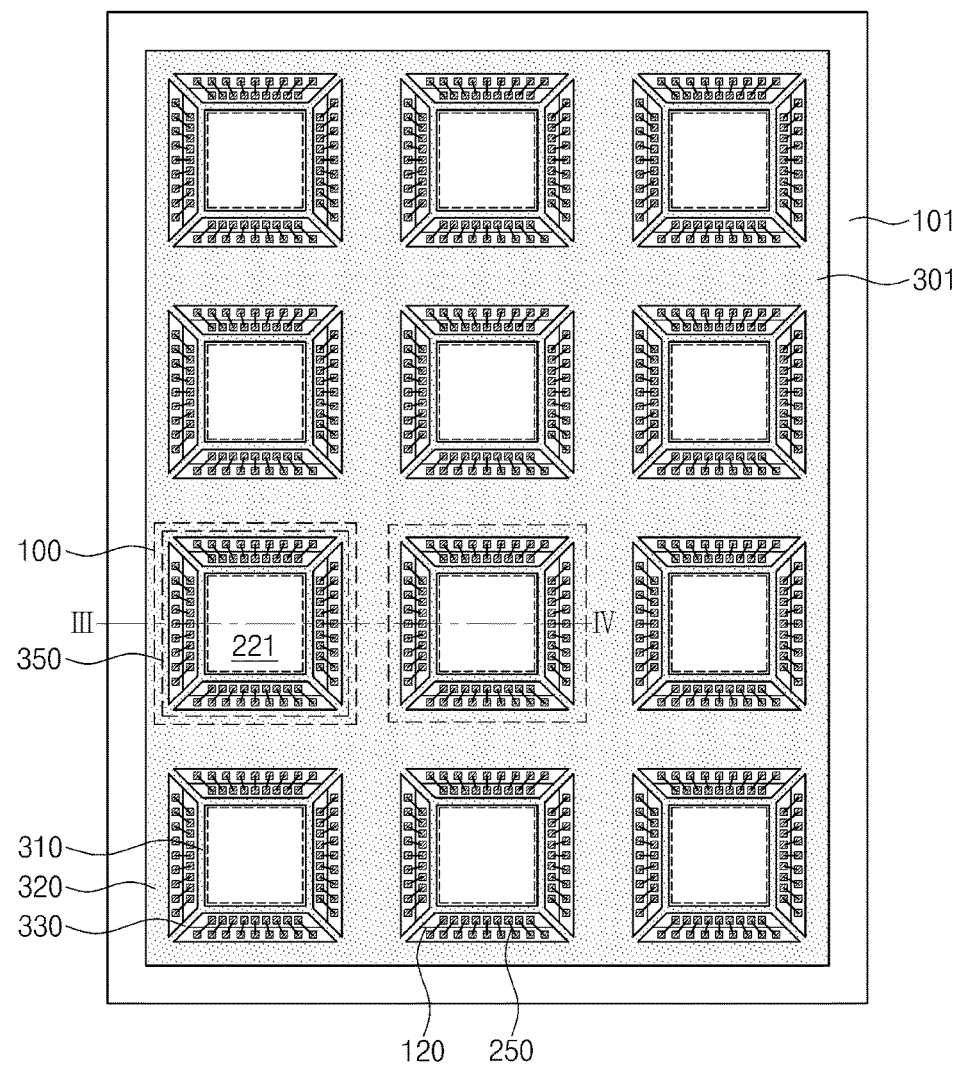
FIGS. 6A and 7A are plan views illustrating a method for manufacturing a semiconductor package by means of the holder frame of FIG. 5.
Figure 6B:
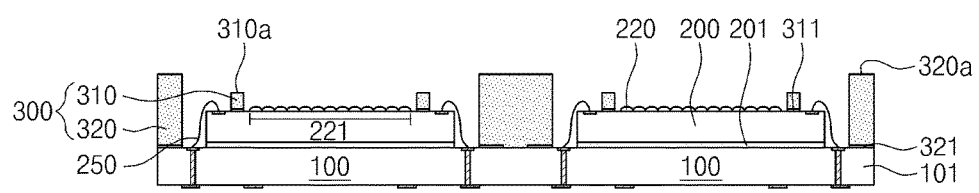
FIGS. 6B, 6C, and 7B are cross-sectional views illustrating a method for manufacturing a semiconductor package by means of the holder frame of FIG. 5.
Figure 6C:
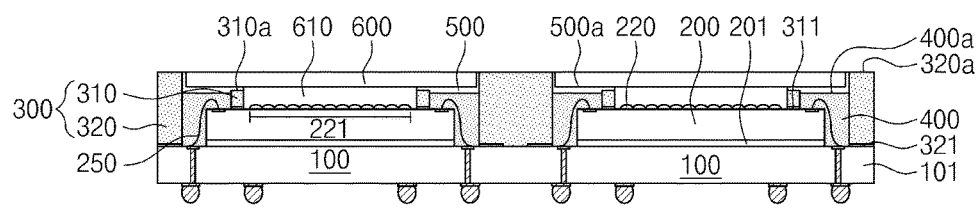
Figure 7A:
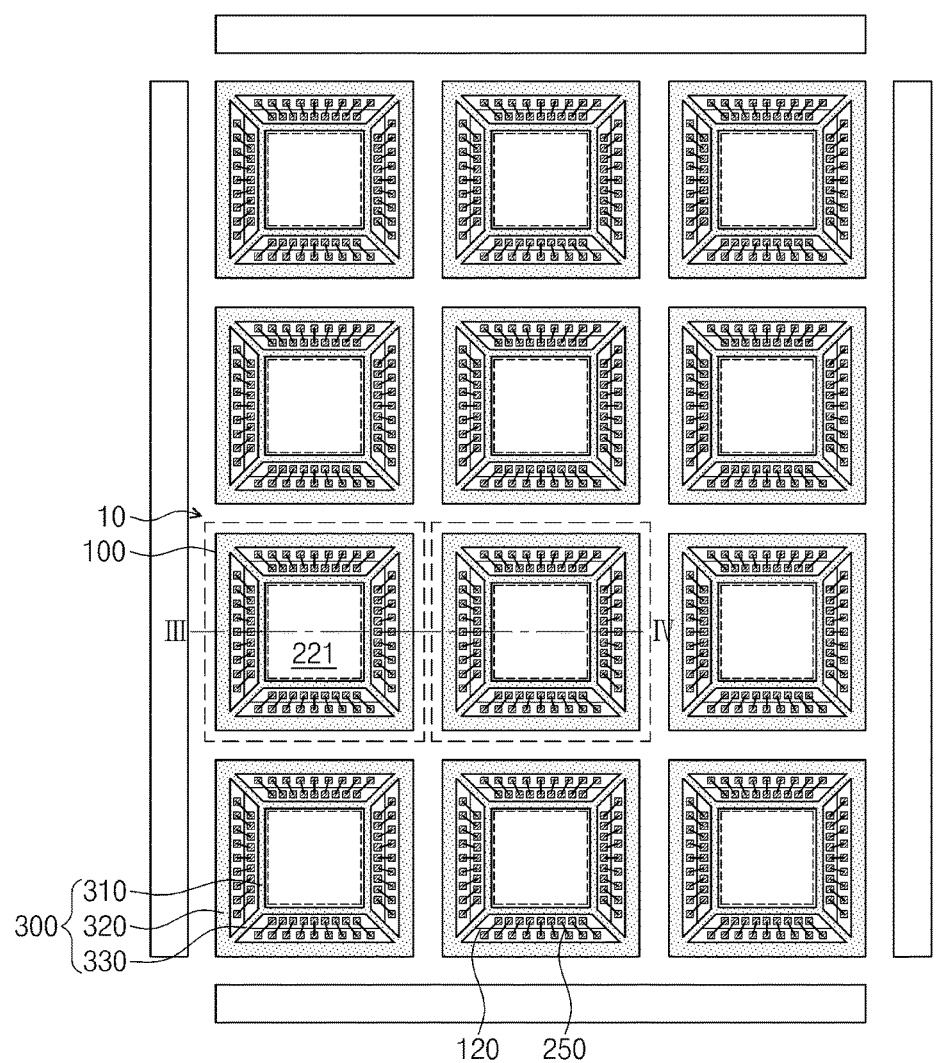
Figure 7B:
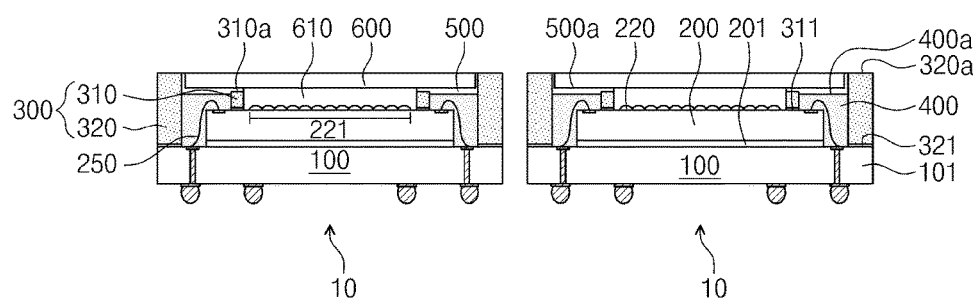

FIGS. 6A and 7A are plan views illustrating a method for manufacturing a semiconductor package by means of the holder frame of FIG. 5. FIGS. 6B, 6C, and 7B are cross-sectional views illustrating a method for manufacturing a semiconductor package by means of the holder frame of FIG. 5. FIGS. 6B and 6C are cross-sectional views taken along a line III-IV of FIG. 6A, and FIG. 7B is a cross-sectional view taken along a line III-IV of FIG. 7A. Hereinafter, a method for manufacturing a plurality of semiconductor packages will be described, and the same descriptions as in the above embodiments will be omitted or mentioned briefly to avoid duplication of explanation.

Referring to FIG. 5, a holder frame 301 including a plurality of unit holder parts 350 may be provided. The unit holder parts 350 may be connected to each other to constitute the holder frame 301. The unit holder parts 350 may be laterally disposed. Each of the unit holder parts 350 may include a first holder 310, a second holder 320, and a connection holder 330.

Referring to FIGS. 6A and 6B, a substrate frame 101 including a plurality of unit substrates 100 may be provided. The substrate frame 101 may be the same as described with reference to FIGS. 2A and 2B. Image sensor chips 200 may be mounted on the unit substrates 100 through bonding wires 250. The holder frame 301 may be provided on the substrate frame 101. At this time, the unit holder parts 350 of the holder frame 301 may be disposed on the unit substrates 100 of the substrate frame 101, respectively. First adhesive films 311 and second adhesive films 321 may be formed to adhere the holder frame 301 onto the substrate frame 101. The first and second adhesive films 311 and 321 may be formed at the same time. The first holder 310, the second holder 320, and the connection holder 330 may be adhered to one of the unit substrates 100 at the substantially same time. The unit holder parts 350 may be adhered to the unit substrates 100 at the same time. According to the present embodiment, the holder frame 301 may be used to simplify the adhesion of unit holder parts 350.

Referring to FIGS. 6C and 6A, molding parts 400, adhesion parts 500, and transparent covers 600 may be formed on the unit substrates 100 of the substrate frame 101, respectively. A method of forming the molding parts 400, the adhesion parts 500, and the transparent covers 600 may be the same as described with reference to FIGS. 3C and 3D.

Referring to FIGS. 7A and 7B, the substrate frame 101 of FIGS. 6A and 6C may be sawed, so the unit substrates 100 may be separated from each other. At this time, the holder frame 301 of FIGS. 6A and 6C may also be sawed, so the unit holder parts 350 may also be separated from each other. The separated unit holder parts 350 may correspond to holders 300, respectively. As a result, the semiconductor package 10 of FIGS. 1A and 1B may be completed.

A semiconductor package and methods for manufacturing the same according to other embodiments will be described hereinafter.

Figure 8A:
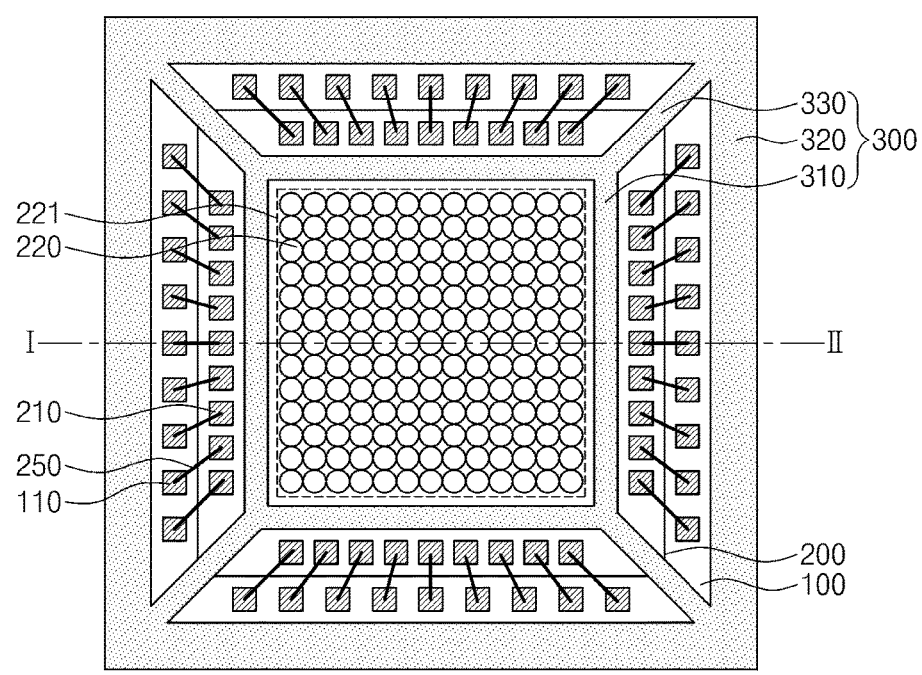
FIG. 8A is a plan view illustrating a semiconductor package according to an embodiment of the inventive concepts.
Figure 8B:
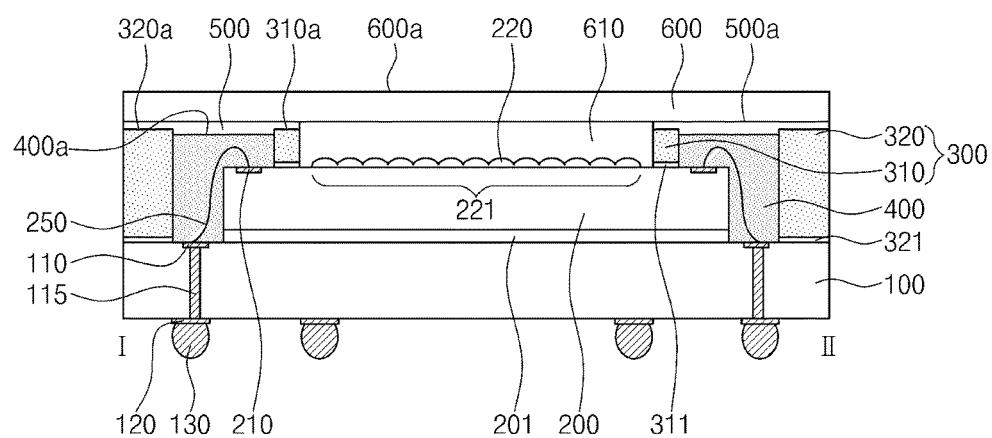
FIG. 8B is a cross-sectional view taken along a line I-II of FIG. 8A.

FIG. 8A is a plan view illustrating a semiconductor package according to an embodiment of the inventive concepts. FIG. 8B is a cross-sectional view taken along a line I-II of FIG. 8A. Hereinafter, a single semiconductor package will be described as an example, and the same descriptions as in the above embodiments will be omitted or mentioned briefly to avoid duplication of explanation.

Referring to FIGS. 8A and 8B, a semiconductor package 12 may include a unit substrate 100, an image sensor chip 200, bonding wires 250, a holder 300, a molding part 400, an adhesion part 500, and a transparent cover 600. An air gap 610 may be formed between the image sensor chip 200 and the transparent cover 600. The unit substrate 100, the image sensor chip 200, the bonding wires 250, and the molding part 400 may be the same as described with reference to FIGS. 1A and 1B.

The holder 300 may be provided on the unit substrate 100. As illustrated in FIG. 8A, the holder 300 may include a first holder 310, a second holder 320, and a connection holder 330. The first holder 310, the second holder 320, and the connection holder 330 may be connected to each other to constitute a holder of one united body. For example, the first holder 310, the second holder 320, and the connection holder 330 may include the same material. Planar positions, planar shapes, and the material of the first holder 310, the second holder 320, and the connection holder 330 may be the same as described with reference to FIGS. 1A and 1B. Unlike FIGS. 1A and 1B, a top surface 320a of the second holder 320 may be disposed at the substantially same level as a top surface 310a of the first holder 310.

The molding part 400 may be provided on the unit substrate 100 to fill a gap region between the first holder 310 and the second holder 320. A top surface 400a of the molding part 400 may be disposed at the substantially same level as or a lower level than the top surface 310a of the first holder 310.

The transparent cover 600 may be disposed on the top surface 310a of the first holder 310, the top surface 400a of the molding part 400, and the top surface 320a of the second holder 320. The adhesion part 500 may be disposed between the holder 300 and the transparent cover 600 and the between the molding part 400 and the transparent cover 600. For example, the adhesion part 500 may cover the top surface 310a of the first holder 310, the top surface 400a of the molding part 400, and the top surface 320a of the second holder 320. The adhesion part 500 may include a photo-curable polymer or a photo/heat dual curable polymer. A top surface 500a of the adhesion part 500 may be substantially flat, so the transparent cover 600 may be adhered to the adhesion part 500 in good condition. Since the adhesion part 500 is provided on the first holder 310, the molding part 400, and the second holder 320, an adhesive area between the transparent cover 600 and the adhesion part 500 may be increased. As a result, the semiconductor package 12 may be sealed in a good condition.

Figure 9A:
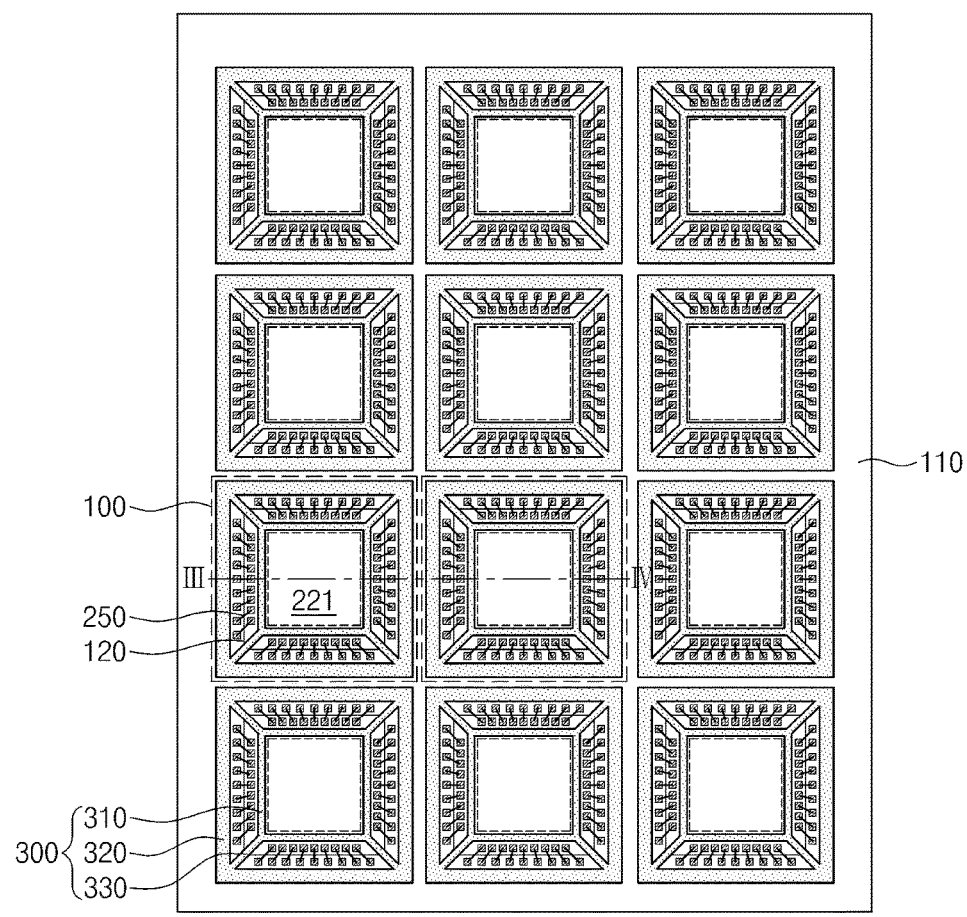
FIG. 9A is a plan view illustrating a method for manufacturing a semiconductor package according to an embodiment of the inventive concepts.
Figure 9B:
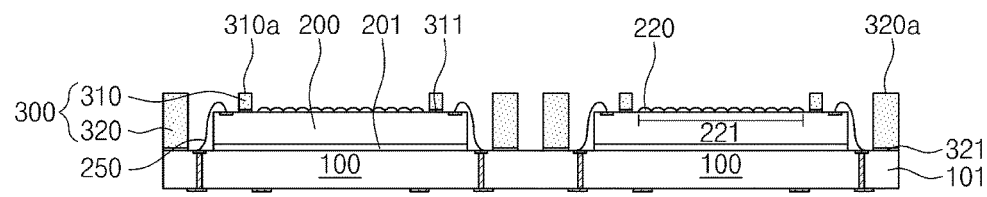
FIGS. 9B, 9C, and 9D are cross-sectional views illustrating a method for manufacturing a semiconductor package according to an embodiment of the inventive concepts.
Figure 9C:
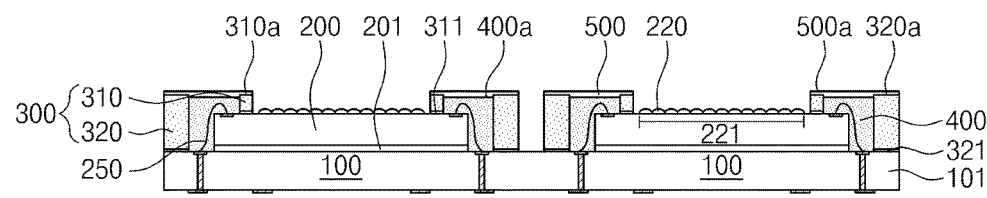
Figure 9D:
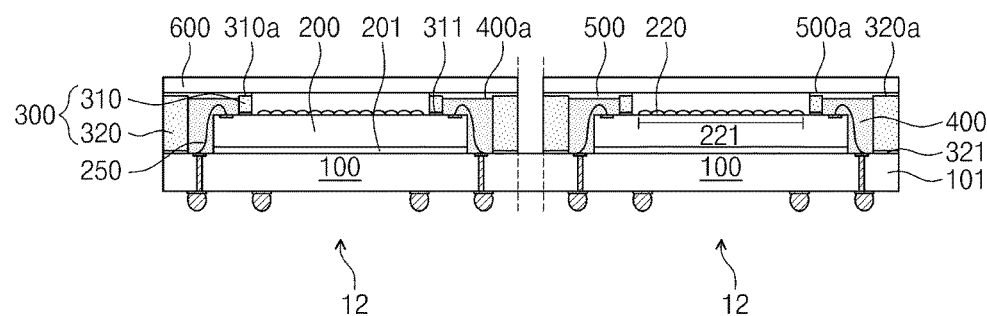

FIG. 9A is a plan view illustrating a method for manufacturing a semiconductor package according to an embodiment of the inventive concepts. FIGS. 9B, 9C, and 9D are cross-sectional views taken along a line III-IV of FIG. 9A to illustrate a method for manufacturing a semiconductor package according to an embodiment of the inventive concepts. Hereinafter, the same descriptions as in the above embodiments will be omitted or mentioned briefly to avoid duplication of explanation.

Referring to FIGS. 9A and 9B, a substrate frame 101 including a plurality of unit substrates 100 may be provided. Image sensor chips 200 may be respectively mounted on the unit substrates 100 by means of bonding wires 250. The image sensor chips 200 may be mounted by the same method as described with reference to FIGS. 3A and 3B.

Holders 300 may be disposed on the unit substrates 100 of the substrate frame 101, respectively. Each of the holders 300 may be the same as described with reference to FIGS. 8A and 8B. The first holder 310, the second holder 320, and the connection holder 330 may be disposed on one of the unit substrates 100 at the substantially same time. At this time, the top surface 320a of the second holder 320 may be disposed at the substantially same level as the top surface 310a of the first holder 310.

Referring to FIGS. 9C and 9A, molding parts 400 may be formed on the unit substrates 100 of the substrate frame 101, respectively. Each of the molding parts 400 may be provided in a gap region between the first holder 310 and the second holder 320 of each of the unit substrates 100. Top surfaces 400a of the molding parts 400 may be disposed at the same level as or a lower level than the top surfaces 310a of the first holders 310.

An adhesion part 500 may be formed on the top surface 310a of the first holder 310, the top surface 400a of the molding part 400, and the top surface 320a of the second holder 320 on each of the unit substrates 100. For example, a photo-curable polymer or a photo/heat dual curable polymer may be applied to the top surfaces 310a of the first holders 310a, the top surfaces 400a of the molding parts 400, and the top surfaces 320a of the second holders 320, so the adhesion parts 500 may be formed. Height differences may occur between the top surface 400a of the molding part 400 and the top surface 310a of the first holder 310 and between the top surface 400a of the molding part 400 and the top surface 320a of the second holder 320. However, since unhardened adhesion parts 500 are fluid, top surfaces 500a of the adhesion parts 500 may be flat.

Referring to FIGS. 9D and 9A, transparent covers 600 may be provided on the unit substrates 100 of the substrate frame 101, respectively. On each of the unit substrates 100, the transparent covers 600 may be provided on the first holder 310, the molding part 400, and the second holder 320 to cover the adhesion part 500. At this time, the adhesion part 500 may not be hardened, so the adhesion part 500 may have fluidity. The fluidity of the adhesion part 500 enables formation of a flat surface for the transparent covers 600 to be adhered. Thus, the transparent covers 600 may be bonded well to the first holders 310, the molding parts 400, and the second holders 320 by the adhesion parts 500. In other words, the transparent covers 600, the holders 300, and the molding parts 400 may be sealed in good condition by the adhesion parts 500. In other embodiments, the top surfaces 500a of the adhesion parts 500 may have the height differences before the process of disposing the transparent covers 600, but the top surfaces 500a of the adhesion parts 500 may be flat after the process of disposing the transparent covers 600. After the transparent covers 600 are disposed, the adhesion parts 500 may be hardened by irradiating ultraviolet rays. In other embodiments, the process of hardening the adhesion parts 500 may further include a second hardening process using heat.

The substrate frame 101 may be sawed to separate the unit substrates 100 from each other (see dotted lines of FIG. 9D). Thus, the manufacture of the semiconductor package 12 of FIGS. 8A and 8B may be completed.

Figure 10A:
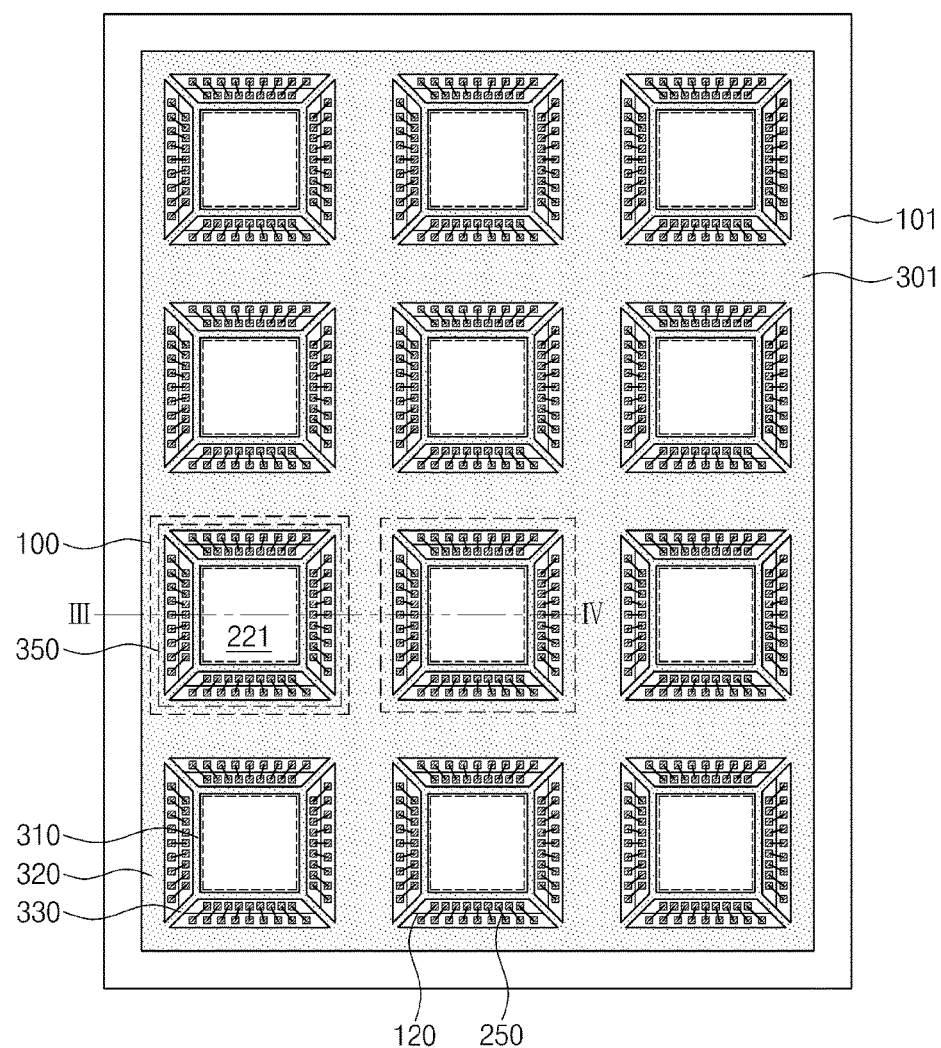
FIG. 10A is a plan view illustrating a method for manufacturing a semiconductor package according to an embodiment of the inventive concepts.
Figure 10B:
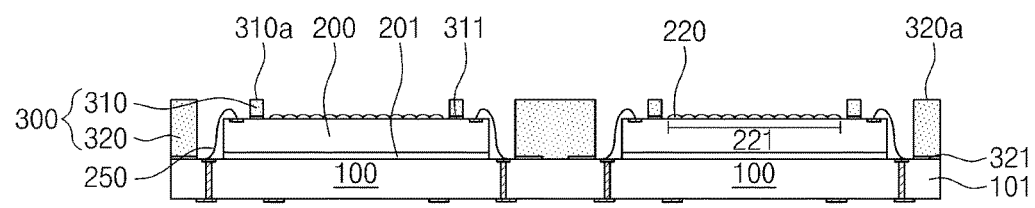
FIGS. 10B and 10C are cross-sectional views illustrating a method for manufacturing a semiconductor package according to an embodiment of the inventive concepts.
Figure 10C:
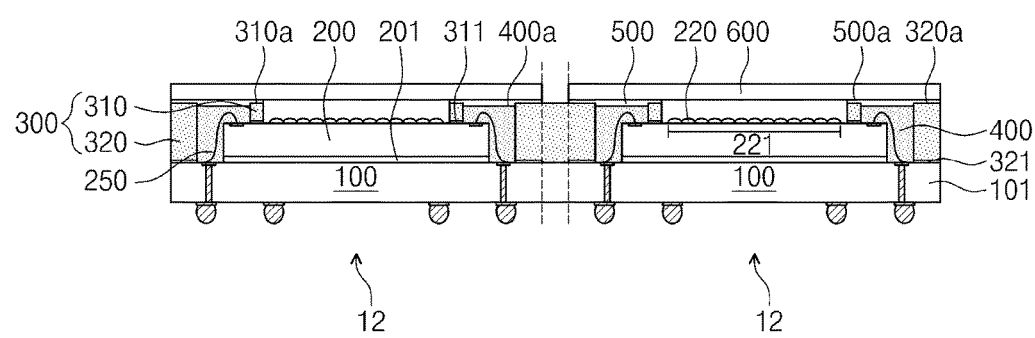

FIG. 10A is a plan view illustrating a method for manufacturing a semiconductor package according to an embodiment of the inventive concepts. FIGS. 10B and 10C are cross-sectional views taken along a line III-IV of FIG. 10A to illustrate a method for manufacturing a semiconductor package according to an embodiment of the inventive concepts. Hereinafter, a method for manufacturing a plurality of semiconductor packages will be described, and the same descriptions as in the above embodiments will be omitted or mentioned briefly to avoid duplication of explanation.

Referring to FIGS. 10A and 10B, image sensor chips 200 may be respectively mounted on unit substrates 100 of a substrate frame 101 by means of bonding wires 250. The image sensor chips 200 may be mounted by the same method as described with reference to FIGS. 3A and 3B.

The holder frame 301 described with reference to FIG. 5 may be provided on the substrate frame 101. The unit holder parts 350 of the holder frame 301 may be disposed on the unit substrates 100 of the substrate frame 101, respectively. The holder frame 301 may be used to bond the first holders 310, the second holders 320, and the connection holders 330 to the substrate frame 101 at the same time.

Referring to FIGS. 10C and 10A, molding parts 400, adhesion parts 500, and transparent covers 600 may be formed on the unit substrates 100 of the substrate frame 101, respectively. The molding parts 400, the adhesion parts 500, and the transparent covers 600 may be formed by the same method as described with reference to FIGS. 9C and 9D.

The substrate frame 101 may be sawed to separate the unit substrates 100 from each other (see dotted lines of FIG. 10C). At this time, the holder frame 301 may also be sawed to separate the unit holder parts 350 from each other. The separated unit holder parts 350 may correspond to the holders 300, respectively. As a result, the manufacture of the semiconductor package 12 of FIGS. 8A and 8B may be completed.

A semiconductor packages and methods for manufacturing the same according to still other embodiments will be described. Hereinafter, the same descriptions as in the above embodiments will be omitted or mentioned briefly to avoid duplication of explanation.

Figure 11A:
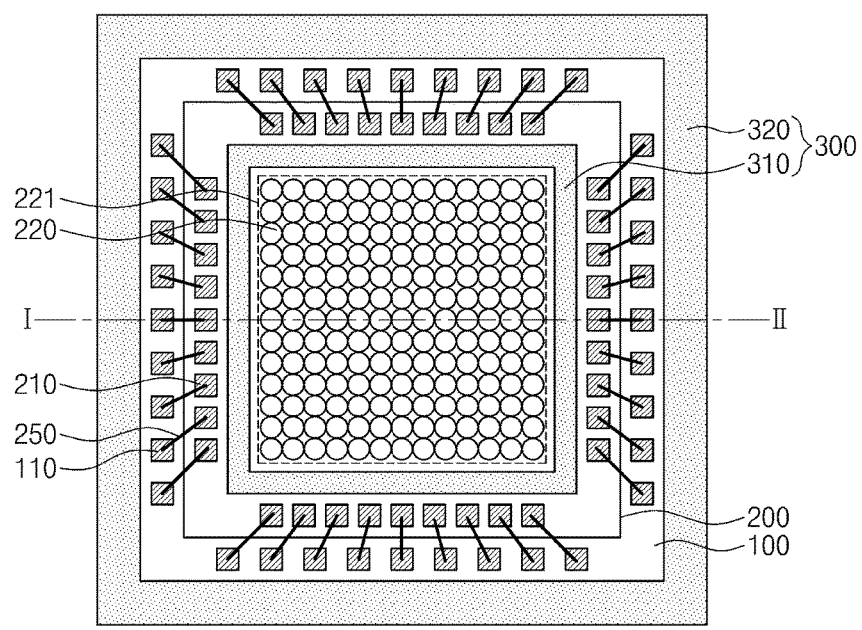
FIG. 11A is a plan view illustrating a semiconductor package according to an embodiment of the inventive concepts.
Figure 11B:
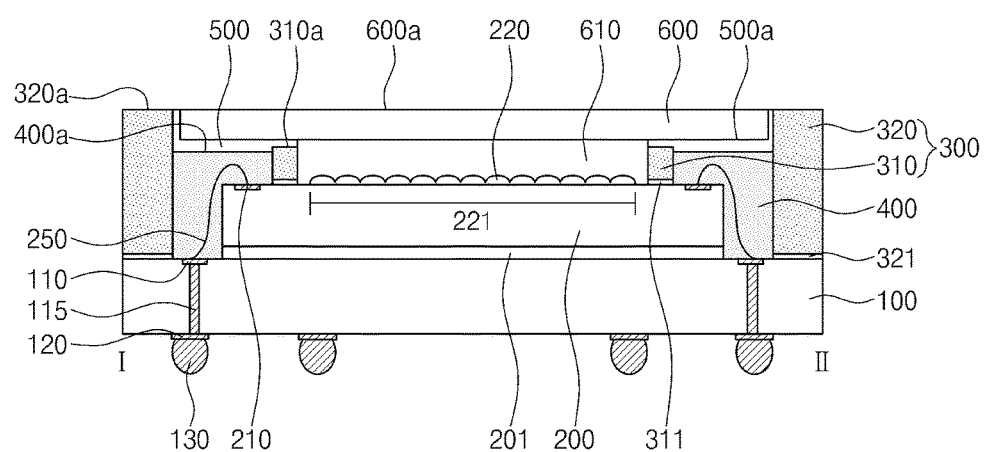
FIG. 11B is a cross-sectional view taken along a line I-II of FIG. 11A.

FIG. 11A is a plan view illustrating a semiconductor package according to an embodiment of the inventive concepts. FIG. 11B is a cross-sectional view taken along a line I-II of FIG. 11A. Hereinafter, one semiconductor package will be described.

Referring to FIGS. 11A and 11B, a semiconductor package 13 may include a unit substrate 100, an image sensor chip 200, bonding wires 250, a holder 300, a molding part 400, an adhesion part 500, and a transparent cover 600. An air gap 610 may be provided between the image sensor chip 200 and the transparent cover 600. The unit substrate 100, the image sensor chip 200, the bonding wires 250, the molding part 400, and the adhesion part 500 may be the same as described with reference to FIGS. 1A and 1B.

The holder 300 may be provided on the unit substrate 100. The holder 300 may include a first holder 310 and a second holder 320. For example, the first holder 310 may be disposed on the image sensor chip 200. The second holder 320 may be fixed on an edge area of the unit substrate 100 and may be laterally spaced apart from the image sensor chip 200. A top surface 320a of the second holder 320 may be disposed at a higher level than a top surface 310a of the first holder 310a. Unlike FIGS. 1A and 1B, the connection holder may be omitted, and the second holder 320 may not be connected to the first holder 310. The second holder 320 may include, but not limited to, a different material from the first holder 310.

The molding part 400 may be provided on the unit substrate 100 to fill a gap region between the first holder 310 and the second holder 320.

The transparent cover 600 may be disposed on the top surface 310a of the first holder 310, a top surface 400a of the molding part 400, and an inner sidewall of the second holder 320. The adhesion part 500 may be disposed between the holder 300 and the transparent cover 600 and between the molding part 400 and the transparent cover 600. A top surface 600a of the transparent cover 600 may be disposed at the same level as or a higher level than the top surface 320a of the second holder 320.

Figure 12A:
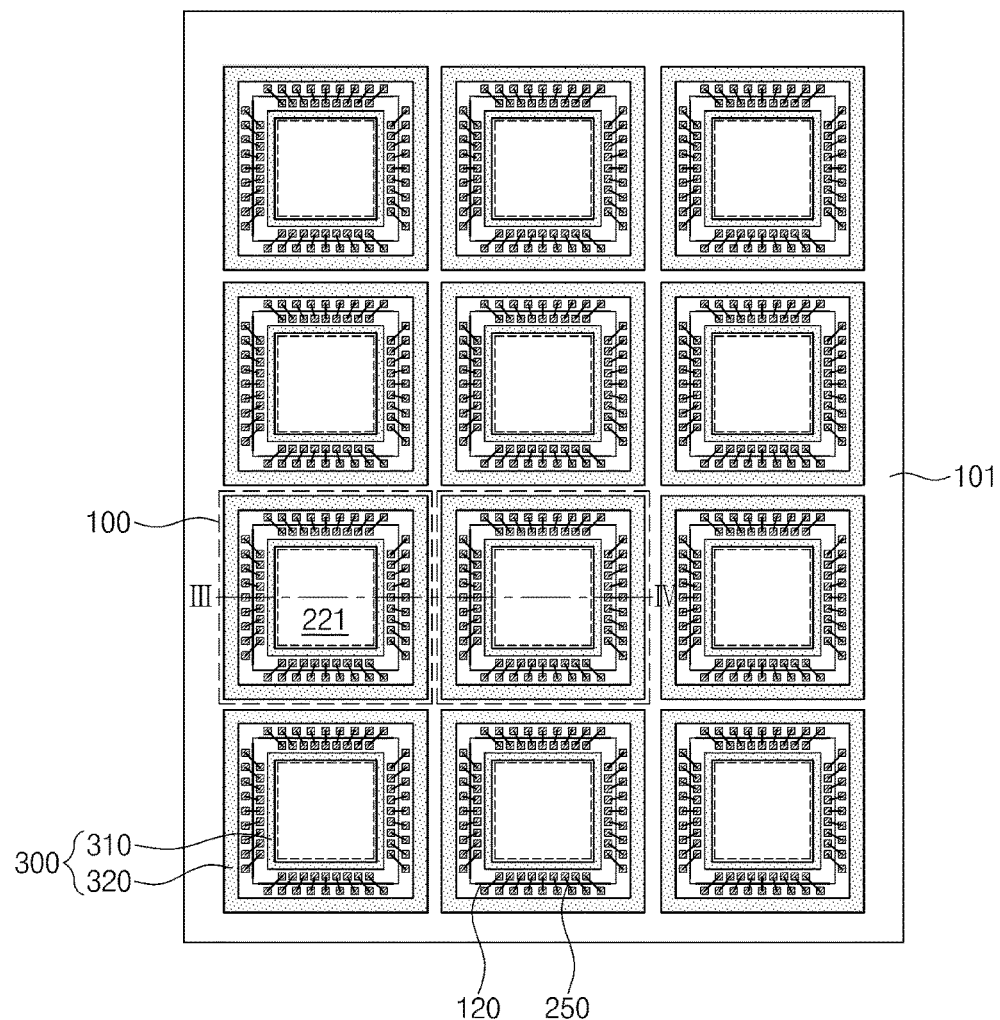
FIG. 12A is a plan view illustrating a method for manufacturing a semiconductor package according to an embodiment of the inventive concepts.
Figure 12B:
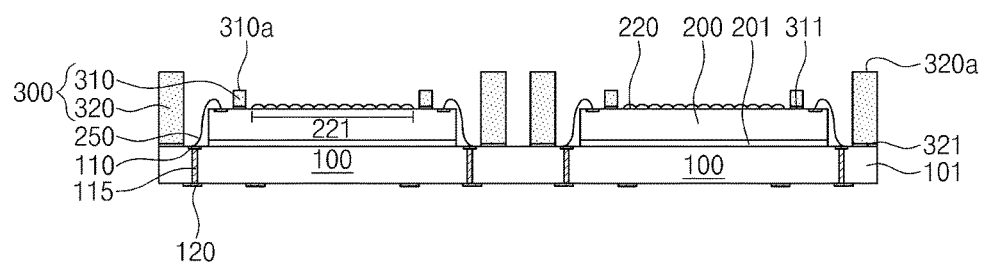
FIGS. 12B and 12C are cross-sectional views illustrating a method for manufacturing a semiconductor package according to an embodiment of the inventive concepts.
Figure 12C:
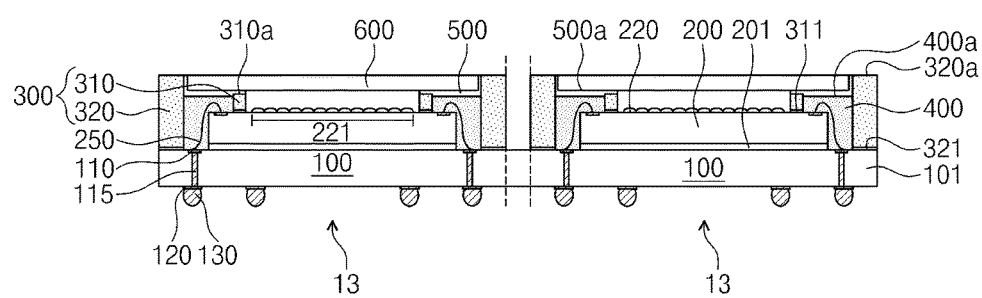

FIG. 12A is a plan view illustrating a method for manufacturing a semiconductor package according to an embodiment of the inventive concepts. FIGS. 12B and 12C are cross-sectional views taken along a line III-IV of FIG. 12A to illustrate a method for manufacturing a semiconductor package according to an embodiment of the inventive concepts. Hereinafter, a method for manufacturing a plurality of semiconductor packages will be described, and the same descriptions as in the above embodiments will be omitted or mentioned briefly to avoid duplication of explanation.

Referring to FIGS. 12A and 12B, image sensor chips 200 may be respectively mounted on unit substrates 100 of a substrate frame 101 by means of bonding wires 250. The bonding wires 250 may be formed by a bonding wire apparatus (not shown) including a capillary.

First holders 310 and second holders 320 may be located on the unit substrates 100 of the substrate frame 101, respectively. The second holders 320 may not be connected to the first holders 310. The first holder 310 may be located at a different time from the second holders 320. For example, the second holders 320 may be located after the first holders 310 are located. Alternatively, the second holders 320 may be located before the first holders 310 are located. Top surfaces 320a of the second holders 320 may be disposed at a higher level than top surfaces 310a of the first holders 310.

According to the embodiments of the inventive concepts, the process of locating the holders 300 may be performed after the process of mounting the image sensor chips 200. Thus, during the process of mounting the image sensor chips 200, the bonding wire apparatus may not be limited to the holders 300 but may freely move.

Referring to FIGS. 12C and 12A, molding parts 400, adhesion parts 500, and transparent covers 600 may be formed on the substrate frame 101. The molding parts 400, the adhesion parts 500, and the transparent covers 600 may be formed by the same method as described with reference to FIGS. 3C and 3D.

The substrate frame 101 may be sawed along dotted lines of FIG. 12C to separate the unit substrates 100 from each other. Thus, the semiconductor package 13 of FIGS. 11A and 11B may be completed.

Figure 13A:
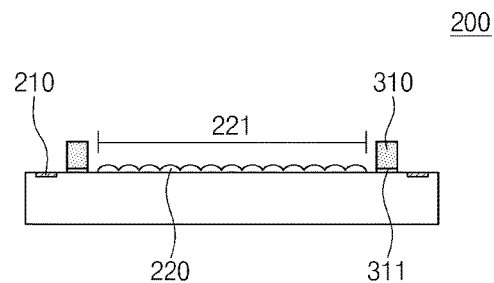
FIGS. 13A to 13C are cross-sectional views illustrating a method for manufacturing a semiconductor package according to an embodiment of the inventive concepts.
Figure 13B:
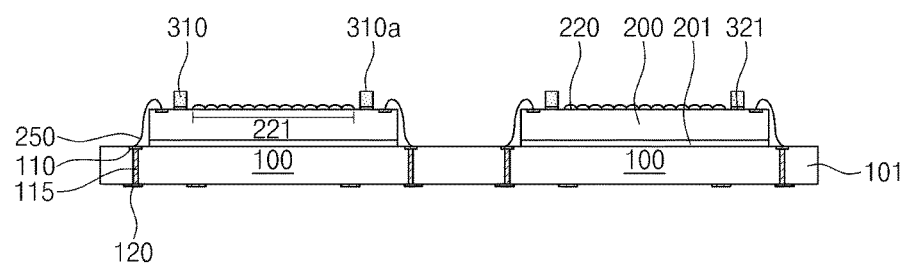
Figure 13C:
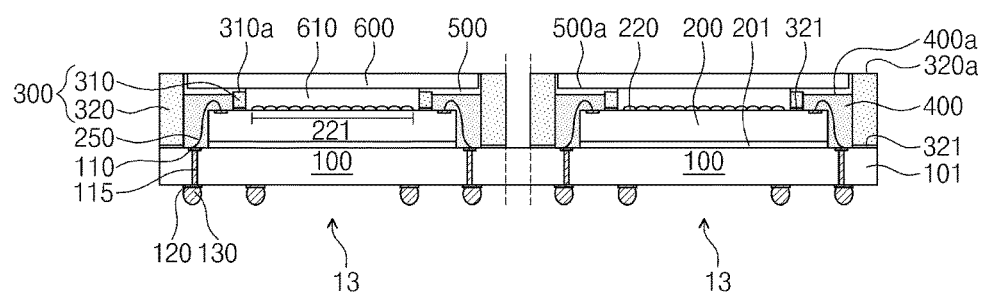

FIGS. 13A to 13C are cross-sectional views illustrating a method for manufacturing a semiconductor package according to an embodiment of the inventive concepts. Hereinafter, the same descriptions as in the above embodiments will be omitted or mentioned briefly to avoid duplication of explanation.

Referring to FIG. 13A, a first holder 310 may be formed on an image sensor chip 200. The first holder 310 may have the same shape and position as described with reference to FIGS. 11A and 11B. For example, the first holder 310 may be disposed between the pixel area 221 and the connection pads 210 on the image sensor chip 200. The first holder 310 may include a silicon-containing material, a metal, and/or a polymer.

Referring to FIGS. 13B and 12A, a substrate frame 101 including a plurality of unit substrates 100 may be provided. Image sensor chips 200 may be respectively mounted on the unit substrates 100 by means of bonding wires 250. At this time, each of the image sensors 200 may be the image sensor chip 200 having the first holder 310 of FIG. 13A.

Referring to FIGS. 13C and 12A, a second holder 320 may be bonded onto an edge area of the unit substrate 100 in such a way that the second holder 320 is laterally spaced apart from the image sensor chip 200. The process of bonding (or locating) the second holder 320 may be performed after the process of providing the first holder 310 onto the substrate frame 101. Molding parts 400, adhesion parts 500, and transparent covers 600 may be formed on the substrate frame 101. The substrate frame 101 may be sawed along dotted lines of FIG. 13C to separate the unit substrates 100 from each other. As a result, the semiconductor package 13 of FIGS. 11A and 11B may be completed.

Figure 14:
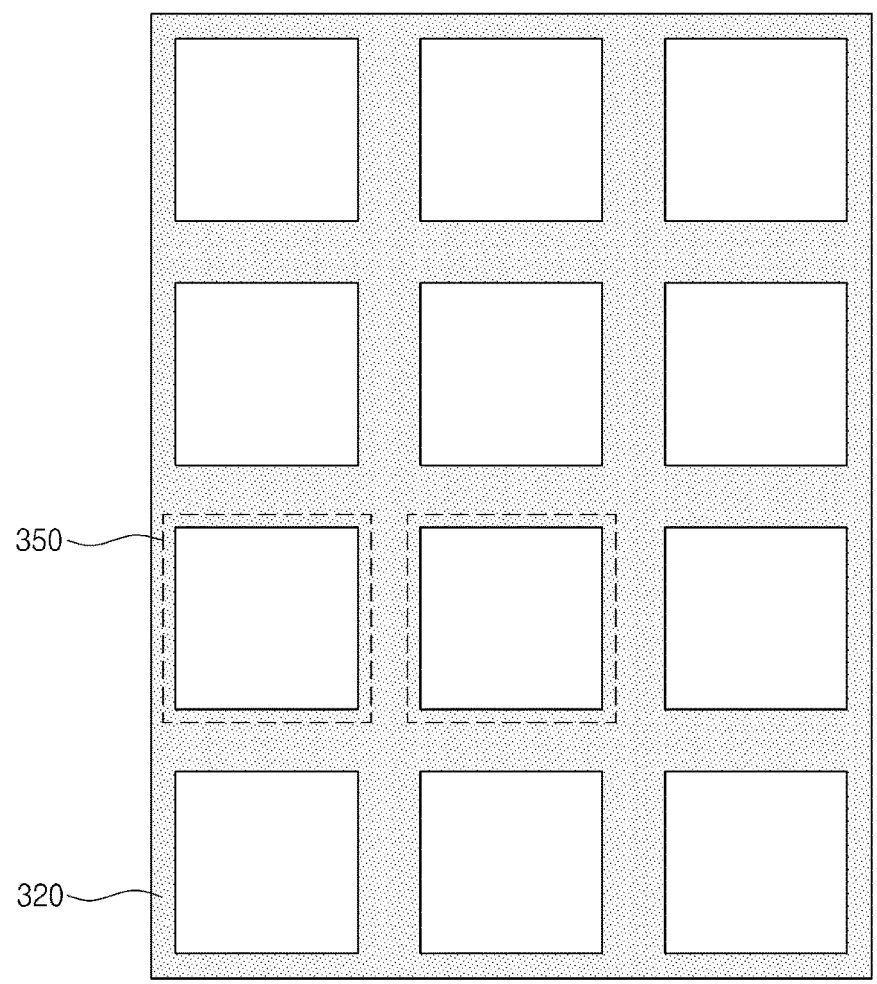
FIG. 14 is a plan view illustrating a holder frame according to an embodiment of the inventive concepts.

FIG. 14 is a plan view illustrating a holder frame according to an embodiment of the inventive concepts.

Figure 15A:
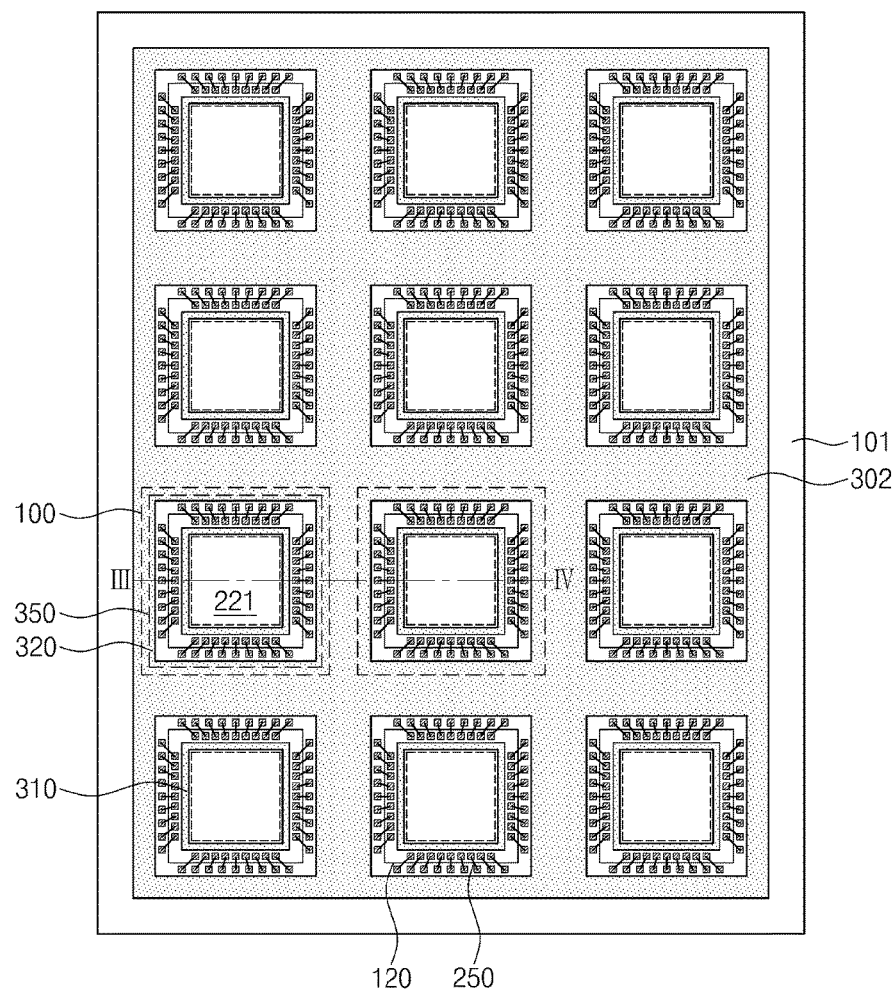
FIG. 15A is a plan view illustrating a method for manufacturing a semiconductor package according to an embodiment of the inventive concepts.
Figure 15B:
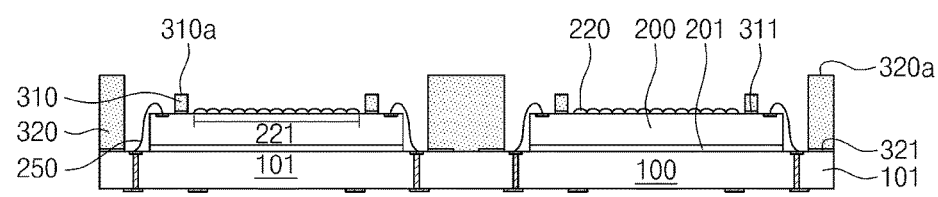
FIGS. 15B and 15C are cross-sectional views illustrating a method for manufacturing a semiconductor package according to an embodiment of the inventive concepts.
Figure 15C:
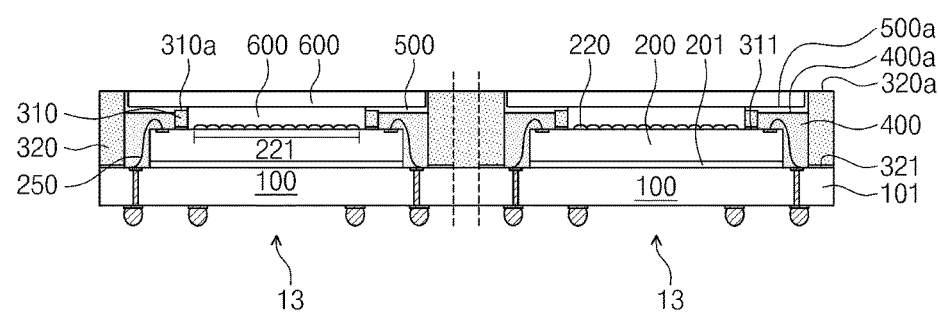

FIG. 15A is a plan view illustrating a method for manufacturing a semiconductor package according to an embodiment of the inventive concepts. FIGS. 15B and 15C are cross-sectional views taken along a line III-IV of FIG. 14A to illustrate a method for manufacturing a semiconductor package according to an embodiment of the inventive concepts. Hereinafter, a method for manufacturing a plurality of semiconductor packages will be described, and the same descriptions as in the above embodiments will be omitted or mentioned briefly to avoid duplication of explanation.

Referring to FIG. 14, a holder frame 302 including a plurality of unit holder parts 350 may be provided. The holder frame 302 may include a plurality of second holders 320 connected to each other. Each of the second holders 320 may correspond to each of the unit holder part 350.

Referring to FIGS. 15A and 15B, a substrate frame 101 including a plurality of unit substrates 100 may be provided. Image sensor chips 200 may be respectively mounted on the unit substrates 100 by means of bonding wires 250. First holders 310 may be located on the image sensor chips 200 of the unit substrates 100, respectively. The first holders 310 may not located on the substrate frame 101 at the same time. The unit holder parts 350 of the holder frame 302 may be located on the unit substrates 100 of the substrate frame 101, respectively. According to embodiments of the inventive concepts, the holder frame 302 may be used to locate the second holders 320 on the substrate frame 101 at the same time. Bonding the second holders 320 may be simplified by the use of the holder frame 302. The process of locating the first holders 310 may be performed at a different time from the process of locating the second holders 320. For example, the first holders 310 may be located on the unit substrates 100 before or after the process of bonding the holder frame 302 to the substrate frame 101.

In other embodiments, the image sensor chip 200 described with reference to FIG. 13A may be used in the present embodiment. For example, the image sensor chips 200 of the present embodiment may correspond to the image sensor chips 200 on which the first holders 310 are provided. In this case, the first holders 310 may be located on the unit substrates 100 before the process of bonding the holder frame 302 to the substrate frame 101.

Referring to FIGS. 15C and 15A, molding parts 400, adhesion parts 500, and transparent covers 600 may be formed on the unit substrates 100 of the substrate frame 101.

The substrate frame 101 may be sawed along dotted lines of FIG. 15C to separate the unit substrates 100 from each other. At this time, the holder frame 302 may also be sawed to separate the second holders 320 of the unit holder parts 350 from each other. As a result, the semiconductor package 13 of FIGS. 11A and 11B may be manufactured.

A semiconductor package and methods for manufacturing the same according to yet other embodiments will be described hereinafter.

Figure 16A:
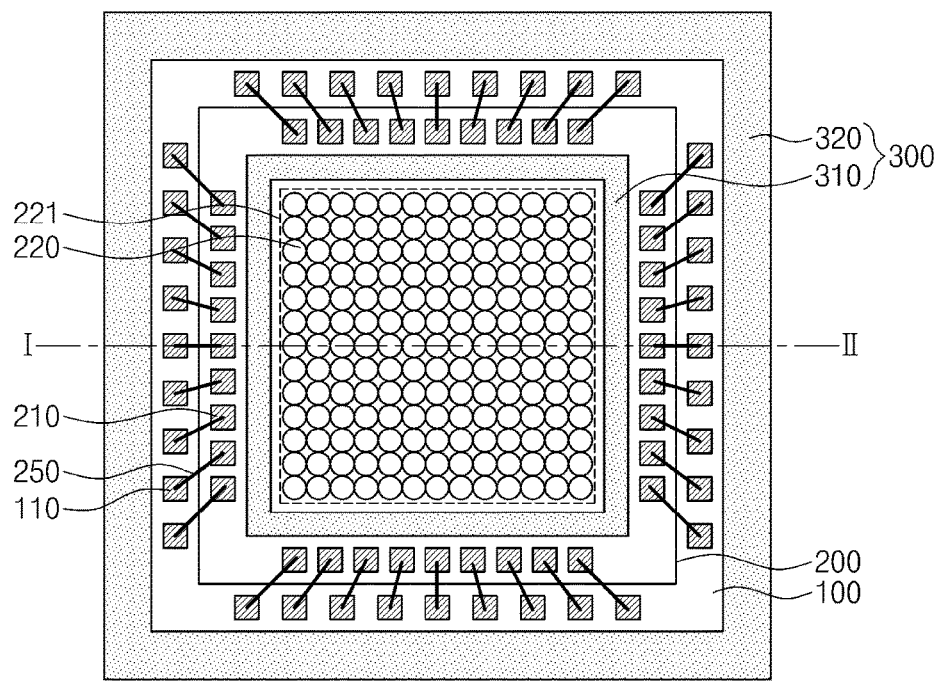
FIG. 16A is a plan view illustrating a semiconductor package according to an embodiment of the inventive concepts.
Figure 16B:
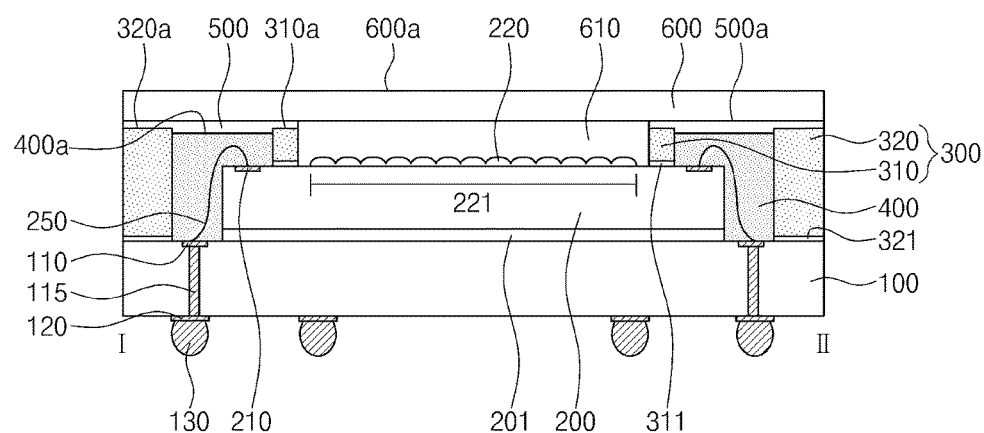
FIG. 16B is a cross-sectional view taken along a line I-II of FIG. 16A.

FIG. 16A is a plan view illustrating a semiconductor package according to an embodiment of the inventive concepts. FIG. 16B is a cross-sectional view taken along a line I-II of FIG. 16A. Hereinafter, one semiconductor package will be described, and the same descriptions as in the above embodiments will be omitted or mentioned briefly to avoid duplication of explanation.

Referring to FIGS. 16A and 16B, a semiconductor package 14 may include a unit substrate 100, an image sensor chip 200, bonding wires 250, a holder 300, a molding part 400, an adhesion part 500, and a transparent cover 600. An air gap 610 may be provided between the image sensor chip 200 and the transparent cover 600. The unit substrate 100, the image sensor chip 200, and the bonding wires 250 may be the same as described with reference to FIGS. 1A and 1B.

The holder 300 may be provided on the unit substrate 100. The holder 300 may include a first holder 310 and a second holder 320. The second holder 320 may not be connected to the first holder 310. The second holder 320 may include, but not limited to, a different material from the first holder 310. The first holder 310 may be disposed on the image sensor chip 200. The second holder 320 may be fixed on an edge area of the unit substrate 100 and may be laterally spaced apart from the image sensor chip 200. A top surface 320a of the second holder 320 may be disposed at the substantially same level as a top surface 310a of the first holder 310a.

The molding part 400 may be provided on the unit substrate 100 to fill a gap region between the first holder 310 and the second holder 320. The transparent cover 600 may be disposed on the top surface 310a of the first holder 310, a top surface 400a of the molding part 400, and the top surface 320a of the second holder 320. The adhesion part 500 may be disposed between the holder 300 and the transparent cover 600 and between the molding part 400 and the transparent cover 600.

Figure 17A:
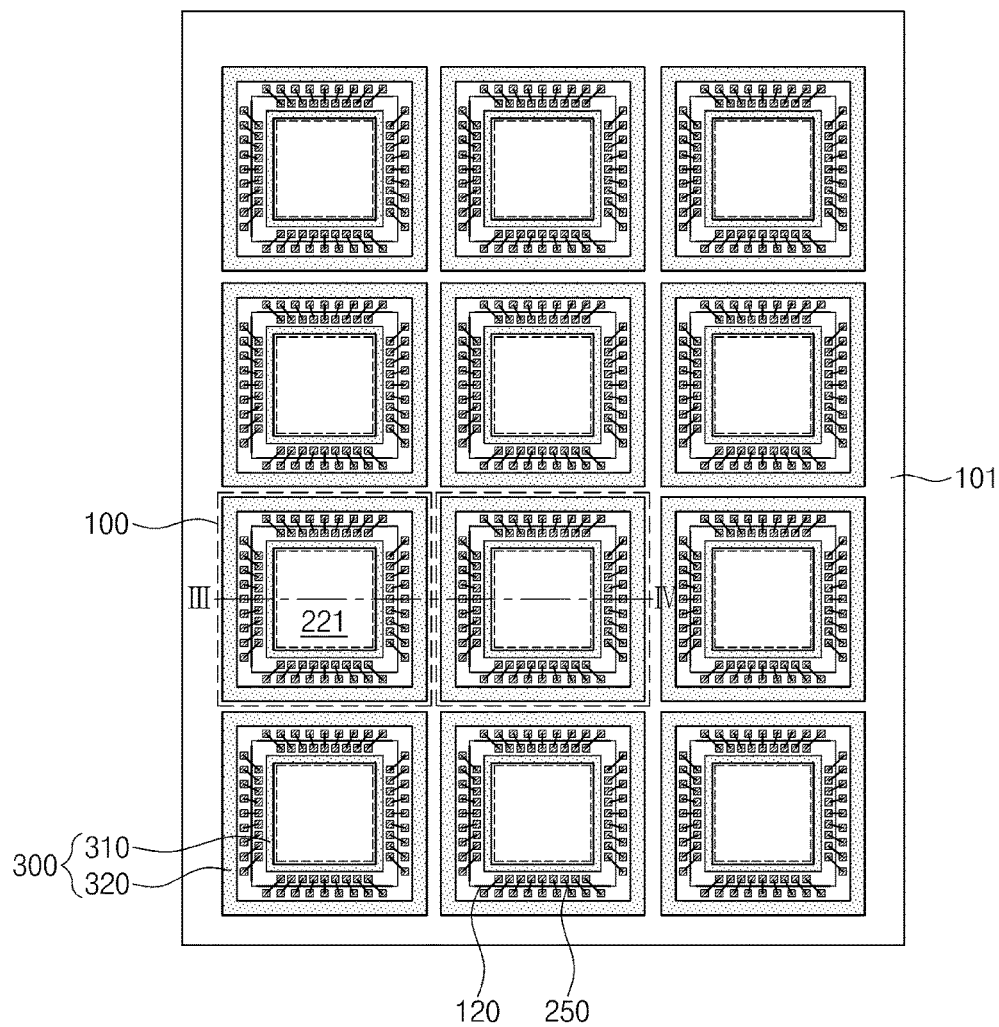
FIG. 17A is a plan view illustrating a method for manufacturing a semiconductor package according to an embodiment of the inventive concepts.
Figure 17B:
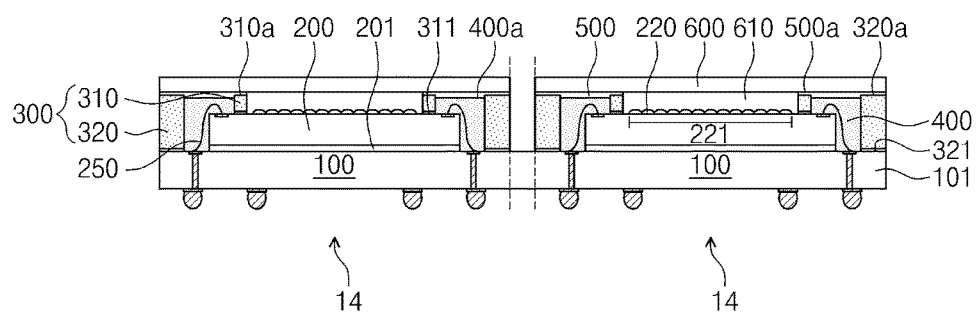
FIG. 17B is a cross-sectional view taken along a line III-IV of FIG. 17A.

FIG. 17A is a plan view illustrating a method for manufacturing a semiconductor package according to an embodiment of the inventive concepts. FIG. 17B is a cross-sectional view taken along a line III-IV of FIG. 17A to illustrate a method for manufacturing a semiconductor package according to an embodiment of the inventive concepts. Hereinafter, a method for manufacturing a plurality of semiconductor packages will be described, and the same descriptions as in the above embodiments will be omitted or mentioned briefly to avoid duplication of explanation.

Referring to FIGS. 17A and 17B, image sensor chips 200 may be respectively mounted on unit substrates 100 of a substrate frame 101 by means of bonding wires 250.

A first holder 310 and a second holder 320 may be located on each of the unit substrates 100 of the substrate frame 101. The second holder 320 may not be connected to the first holder 310. A top surface 320a of the second holder 320 may be disposed at the substantially same level as a top surface 310a of the first holder 310. The first holder 310 and the second holder 320 may not be located at the same time.

In other embodiments, the image sensor chip 200 described with reference to FIG. 13A may be provided on the substrate frame 101. The image sensor chips 200 of the present embodiment may correspond to the image sensor chip 200 on which the first holder 310 is provided. In this case, the second holders 320 may be located on the unit substrates 100 after the image sensor chips 200 are mounted on the unit substrates 100.

Molding parts 400, adhesion parts 500, and transparent covers 600 may be formed on the unit substrates 100 of the substrate frame 101, respectively. The substrate frame 101 may be sawed along dotted lines of FIG. 17B to separate the unit substrates 100 from each other. As a result, the semiconductor package 14 of FIGS. 16A and 16B may be manufactured.

Figure 18A:
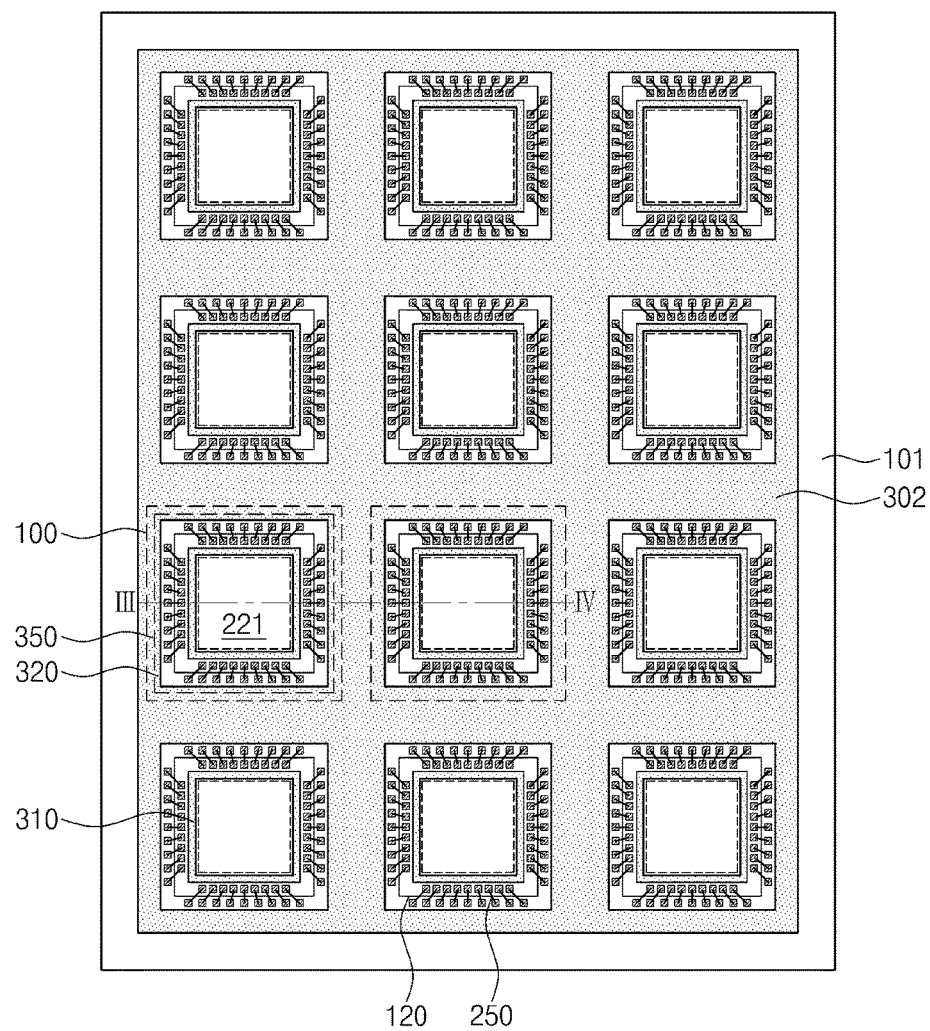
FIG. 18A is a plan view illustrating a method for manufacturing a semiconductor package according to an embodiment of the inventive concepts.
Figure 18B:
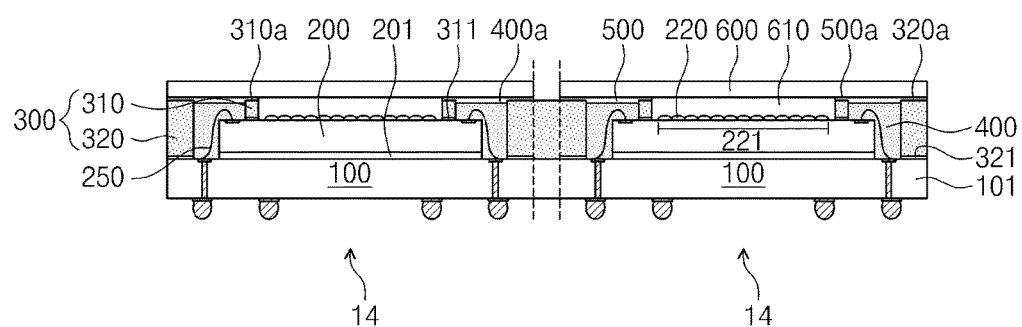
FIG. 18B is a cross-sectional view taken along a line III-IV of FIG. 18A.

FIG. 18A is a plan view illustrating a method for manufacturing a semiconductor package according to an embodiment of the inventive concepts. FIG. 18B is a cross-sectional view taken along a line III-IV of FIG. 18A to illustrate a method for manufacturing a semiconductor package according to an embodiment of the inventive concepts. Hereinafter, a method for manufacturing a plurality of semiconductor packages will be described, and the same descriptions as in the above embodiments will be omitted or mentioned briefly to avoid duplication of explanation.

Referring to FIGS. 18A and 18B, image sensor chips 200 may be respectively mounted on unit substrates 100 of a substrate frame 100 by means of bonding wires 250. Unit holder parts 350 of a holder frame 302 may be located on the unit substrates 100 of the substrate frame 101, respectively. The holder frame 302 of the present embodiment may be the holder frame 302 described with reference to FIG. 14. According to embodiments of the inventive concepts, the holder frame 302 may be used to simplify the process of bonding the second holder holes 320. Since the holder frame 302 is used, a plurality of the second holders 320 may be bonded to the unit substrates 100 of the substrate frame 101 at the same time. The first holders 310 may be located on the unit substrates 100 before or after the holder frame 302 is bonded to the substrate frame 101. Top surfaces 320a of the second holders 320 may be disposed at the substantially same level as top surfaces 310a of the first holders 310.

In other embodiments, the image sensor chip 200 having the first holder 310 of FIG. 13A may be used in the present embodiment.

Molding parts 400, adhesion parts 500, and transparent covers 600 may be formed on the unit substrates 100 of the substrate frame 101, respectively. On each of the unit substrates 100, the transparent cover 600 may be disposed on the top surface 310a of the first holder 310, the top surface 320a of the second holder 320, and the top surface 400a of the molding part 400a.

The substrate frame 101 may be sawed along dotted lines of FIG. 18B to separate the unit substrates 100 from each other. At this time, the holder frame 302 may also be sawed to separate the second holders 320 of the unit holder parts 350 from each other. As a result, the semiconductor package 14 of FIGS. 16A and 16B may be manufactured.

A semiconductor package according to yet still other embodiments will be described hereinafter.

Figure 19A:
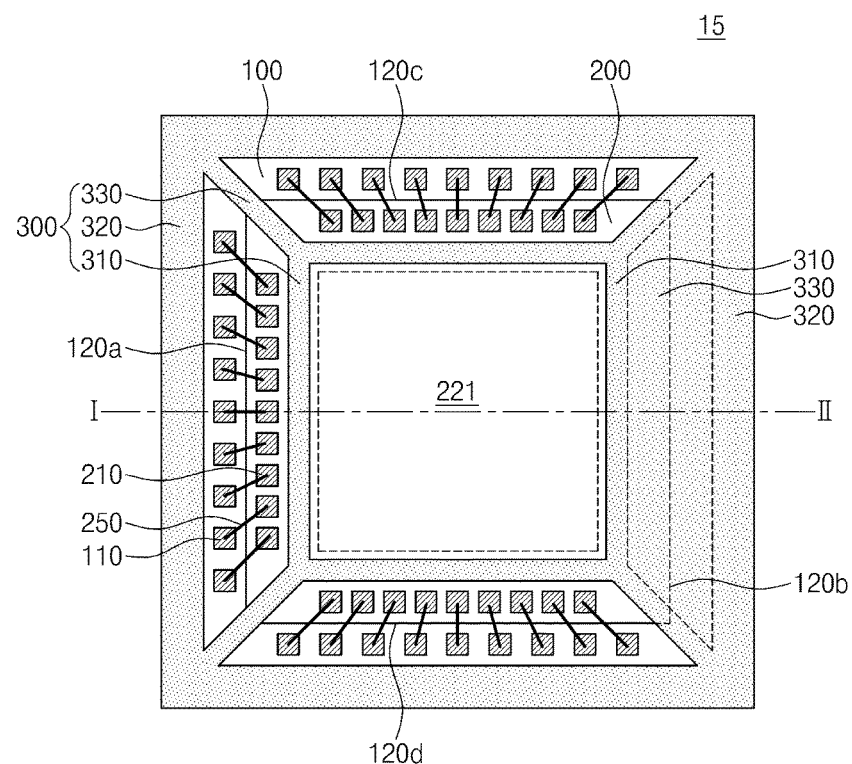
FIG. 19A is a plan view illustrating a semiconductor package according to an embodiment of the inventive concepts.
Figure 19B:
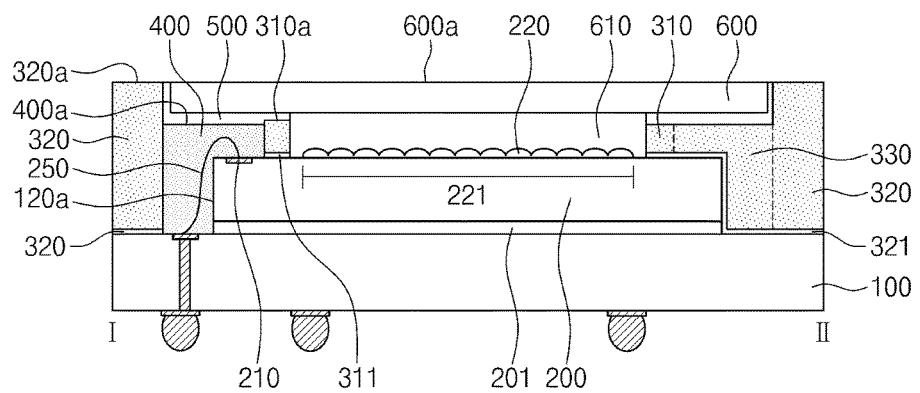
FIG. 19B is a cross-sectional view taken along a line I-II of FIG. 19A.

FIG. 19A is a plan view illustrating a semiconductor package according to an embodiment of the inventive concepts. FIG. 19B is a cross-sectional view taken along a line I-II of FIG. 19A. Hereinafter, the same descriptions as in the above embodiments will be omitted or mentioned briefly to avoid duplication of explanation.

Referring to FIGS. 19A and 19B, a semiconductor package 15 may include a unit substrate 100, an image sensor chip 200, bonding wires 250, a holder 300, a molding part 400, an adhesion part 500, and a transparent cover 600. An air gap 610 may be provided between the image sensor chip 200 and the transparent cover 600. The unit substrate 100, the image sensor chip 200, the adhesion part 500, and the transparent cover 600 may be the same as described with reference to FIGS. 1A and 1B.

A plurality of connection pads 210 may be provided on a top surface of the image sensor chip 200. The image sensor chip 200 may have first, second, third, and fourth sidewalls 120a, 120b, 120c, and 120d. Here, the first sidewall 120a may be opposite to the second sidewall 120b, and the third sidewall 120c may be opposite to the fourth sidewall 120d. The third and fourth sidewalls 120c and 120d may connect both ends of the first sidewall 120a to both ends of the second sidewall 120d. As illustrated in FIG. 19A, the connection pads 210 may be adjacent to the first sidewall 120a, the third sidewall 120c, and the fourth sidewall 120d. The connection pads 210 adjacent to each of the first, third, and fourth sidewalls 120a, 120c, and 120d may be arranged along each of the first, third, and fourth sidewalls 120a, 120c, and 120d. The bonding wires 250 may be in contact with the internal pads 110 of the unit substrate 100 and the connection pads 210 of the image sensor chip 200, respectively. When viewed from a plan view, the bonding wires 250 may overlap with the first, third, and fourth sidewalls 120a, 120c, and 120d of the image sensor chip 200 but may not overlap with the second sidewall 120b.

The holder 300 may be provided on the unit substrate 100. The holder 300 may include a first holder 310, a second holder 320, and a connection holder 330 which are connected to each other. The first holder 310 and the second holder 320 may be the same as described with reference to FIGS. 1A and 1B. The connection holder 330 may intersect the corners of the image sensor chip 200 and may be connected between the first holder 310 and the second holder 320. Unlike FIGS. 1A and 1B, the connection holder 330 of the present embodiment may cover the second sidewall 120b of the image sensor chip 200. In one embodiment, the connection holder 330 may cover a portion of a top surface of the image sensor chip adjacent to the sidewall. Thus, the semiconductor package 15 may be sealed in good condition. A second adhesive film 321 may be disposed between the second holder 320 and the unit substrate 100, between the connection holder 330 and the unit substrate 100, and between the connection holder 330 and the image sensor chip 200.

In other embodiments, the connection holder 330 may not intersect the corner where the first and third sidewalls 120a and 120c meet each other and the corner where the first and fourth sidewalls 120a and 120d meet each other.

The molding part 400 may be provided on the unit substrate 100 to fill a gap region between the first holder 310 and the second holder 320. The transparent cover 600 may be disposed on the top surface 310a of the first holder 310, the top surface 400a of the molding part 400, and the inner sidewall of the second holder 320. The adhesion part 500 may be disposed between the holder 300 and the transparent cover 600 and the molding part 400 and the transparent cover 600.

In other embodiments, as described with reference to FIGS. 8A and 8B, the top surface 320a of the second holder 320 may be disposed at the substantially same level as the top surface 310a of the first holder 310. In this case, the transparent cover 600 may also be disposed on the top surface 320a of the second holder 320.

[Embodiment of Semiconductor Module]

Figure 20:
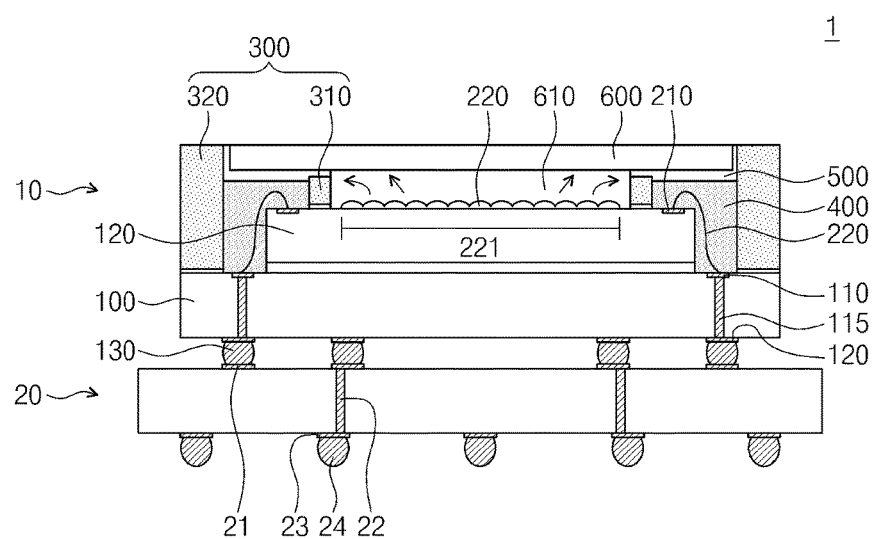
FIG. 20 is a cross-sectional view illustrating a semiconductor module according to an embodiment of the inventive concepts.

FIG. 20 is a cross-sectional view illustrating a semiconductor module according to an embodiment of the inventive concepts. Hereinafter, the same descriptions as in the above embodiments will be omitted or mentioned briefly to avoid duplication of explanation.

Referring to FIG. 20, a semiconductor module 1 may include a package substrate 20 and a semiconductor package 10. The package substrate 20 may be a printed circuit board (PCB). The package substrate 20 may include first pads 21, second pads 23, package through-vias 22, and/or external terminals 24. The first pads 21 may be disposed on a top surface of the package substrate 20, and the second pads 23 may be disposed on a bottom surface of the package substrate 20. The package through-vias 22 may penetrate the package substrate 20 to connect the first pads 21 to the second pads 23. The external terminals 24 may be provided on the second pads 23.

The semiconductor package 10 may be the semiconductor package 10 described with reference to FIGS. 1A and 1B. Alternatively, the semiconductor package 10 may be any one of the semiconductor package 11 of FIG. 1C, the semiconductor package 12 of FIGS. 8A and 8B, the semiconductor package 13 of FIGS. 11A and 11B, the semiconductor package 14 of FIGS. 16A and 16B, and the semiconductor package 15 of FIGS. 19A and 19B.

The semiconductor package 10 may be provided on the package substrate 20. At this time, the connecting terminals 130 may be disposed at positions corresponding to the first pads 21. Thereafter, a soldering process of the connecting terminals 130 may be performed to electrically connect the connecting terminals 130 to the first pads 21. The soldering process may be performed at a temperature equal to or higher than a melting point of the connecting terminals 130 (e.g., at 180° C. or more). Pressure of air existing in an air gap 610 may increase during a process of mounting the semiconductor package 10 using the soldering process. As the pressure of the air inside the air gap increases, it may break the seal provided by the adhesion part 500 to allow air inside the air gap to escape, thereafter allowing the ambient air to enter the air gap. In this case, the image sensor chip 200 may be exposed to external air.

However, according to the aforementioned embodiments of the inventive concepts, the transparent cover 60 may be bonded by the adhesion part 500 in good condition, and thus, it is possible to prevent the image sensor chip 200 from being exposed to the ambient air due to inappropriate sealing of the semiconductor package. Because the first holder 310 may be disposed on the image sensor chip 200, the volume of the air gap 610 may be reduced compared to the configuration where a holder is provided only on an edge area of the semiconductor package. As the volume of the air gap 610 decreases, air mass in the air gap 610 may be reduced. The pressure increase in the air gap 610 may therefore be smaller during the process of mounting the semiconductor package 10 using the soldering process. Thus, damage to the adhesion part 500 due to high air pressure inside the air gap 610 may be minimized or prevented. As a result, reliability of the semiconductor module 1 may be improved.

[Applications]

Figure 21A:
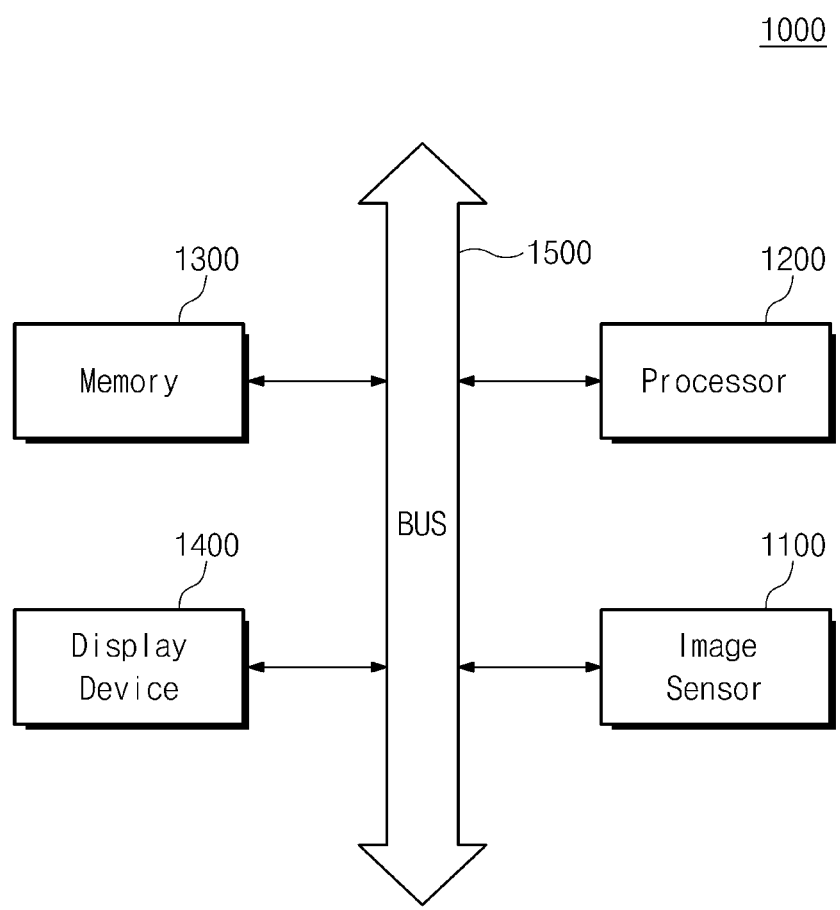
FIG. 21A is a schematic block diagram illustrating a processor-based system implemented with a CMOS image sensor according to embodiments of the inventive concepts.

FIG. 21A is a schematic block diagram illustrating a processor-based system implemented with a CMOS image sensor according to embodiments of the inventive concepts. The processor-based system may be a car, a digital camera, or a mobile device.

Referring to FIG. 21A, a processor-based system 1000 may include an image sensor 1100, a processor 1200, a memory device 1300, a display device 1400, and a system bus 1500. The image sensor 1100 may capture image information in response to control signals of the process 1200. The processor 1200 may store the captured image information in the memory device 1300 through the system bus 1500. The processor 1200 may display the image information stored in the memory device 1300 on the display device 1400.

The system 1000 may be, but not limited to, a computer system, a camera system, a scanner, a mechanized clock system, a navigation system, a video phone, a management system, an auto-focus system, a tracking system, an action recognition system, or an image stabilization system. If the processor-based system 1000 is applied to the mobile device, the system 1000 may further include a battery used for supplying an operating voltage to the mobile device.

Figure 21B:
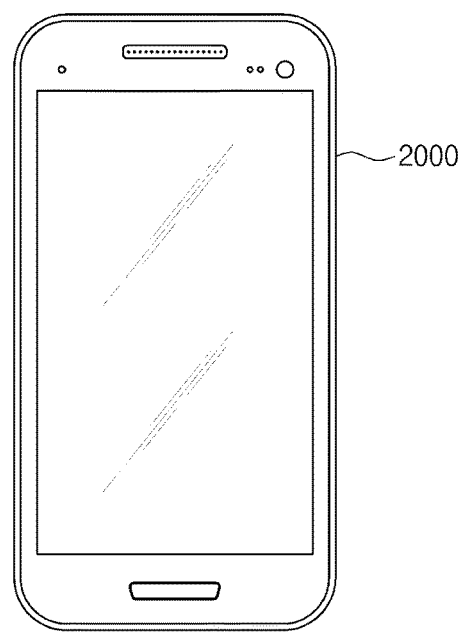
FIGS. 21B and 21C illustrate electronic devices implemented with a CMOS image sensor according to embodiments of the inventive concepts.
Figure 21C:
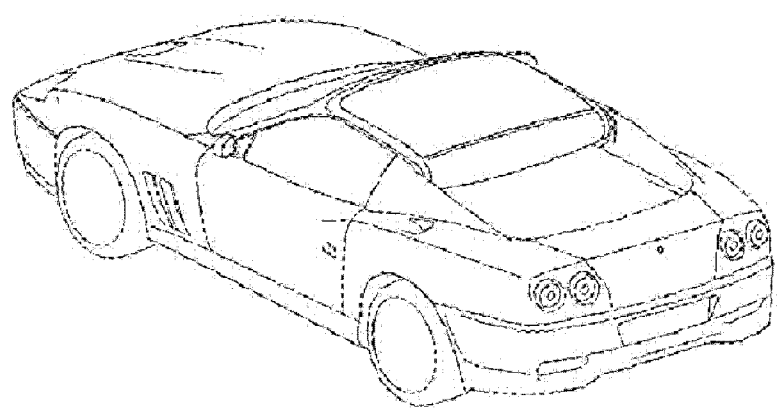

FIGS. 21B and 21C illustrate electronic devices implemented with a CMOS image sensor according to embodiments of the inventive concepts. The semiconductor package including the image sensor chip according to the aforementioned embodiments of the inventive concepts may be applied to various electronic devices having an image photographing function. For example, the semiconductor package according to the above embodiments of the inventive concepts may be applied to a mobile or smart phone 2000 illustrated in FIG. 21B or a car 3000 illustrated in FIG. 21C. In other embodiments, the semiconductor package according to the above embodiments of the inventive concepts may be applied to a personal digital assistant (PDA), a portable multimedia player (PMP), a digital multimedia broadcast (DMB) device, a global positioning system (GPS) device, a handled gaming console, a portable computer, a web tablet, a wireless phone, a digital music player, a memory card, or other electronic products receiving and/or transmitting information data by wireless.

According to embodiments of the inventive concepts, the semiconductor package may be sealed in good condition by means of the first holder, the second holder, and the molding part. The transparent cover may be bonded to the first holder and the molding part by the adhesion part. The transparent cover and the adhesion part may have a relatively wide contact area, so the semiconductor package may be sealed in better condition. The first holder may be disposed on the image sensor chip, so the volume of the air gap may be reduced. As a result, it is possible to reduce or minimize the increase in pressure of the air gap during the mounting process using the soldering process. This means that damage of the adhesion part may be minimized or prevented. According to embodiments of the inventive concepts, it is possible to minimize or prevent the phenomenon that the image sensor chip is exposed to the external air, so the reliability of the semiconductor module may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a substrate;
   an image sensor chip mounted on the substrate;
   a first holder disposed on an edge area of the image sensor chip;
   a second holder disposed laterally spaced apart from the image sensor chip on an edge area of the substrate;
   a molding part provided in a gap region between the first holder and the second holder on the substrate;
   an adhesion part disposed on the first holder and the molding part; and
   a transparent cover disposed on the adhesion part,
   wherein the first holder has a closed loop shape,
   wherein the second holder has a closed loop shape,
   wherein a part of the first holder is separated from the second holder, and
   wherein the adhesion part is in direct contact with the molding part.

2. The semiconductor package of claim 1, further comprising:
   a connection holder connecting the first holder to the second holder on the substrate,
   wherein the first holder, the second holder, and the connection holder include the same material.

3. The semiconductor package of claim 2,
   wherein the connection holder extends in a direction diagonal to a sidewall of the image sensor chip and connects a corner of the first holder to a corner of the second holder.

4. The semiconductor package of claim 2, further comprising:
bonding wires disposed on the substrate to electrically connect the image sensor chip to the substrate,
wherein the bonding wires are laterally spaced apart from the connection holder.

5. The semiconductor package of claim 1,
wherein the adhesion part is disposed between a top surface of the first holder and a bottom surface of the transparent cover and between a top surface of the molding part and the bottom surface of the transparent cover.

6. The semiconductor package of claim 5,
wherein the adhesion part includes a different material from the molding part.

7. The semiconductor package of claim 5,
wherein the top surface of the molding part is disposed at the same level as or a lower level than the top surface of the first holder, and
wherein a top surface of the adhesion part disposed on the molding part is disposed at substantially the same level as a top surface of the adhesion part disposed on the first holder.

8. The semiconductor package of claim 1,
wherein the transparent cover covers a top surface of the second holder.

9. The semiconductor package of claim 1,
wherein the transparent cover is disposed on an inner sidewall of the second holder, and
wherein a top surface of the transparent cover is disposed at substantially a same level as or a higher level than a top surface of the second holder.

10. A semiconductor package comprising:
a substrate;
an image sensor chip mounted on the substrate;
a holder provided on the substrate, the holder including a first holder, a second holder, and a connection holder, the first holder disposed on the image sensor chip, the second holder laterally spaced apart from the image sensor chip, and the connection holder connecting the first holder to the second holder;
a molding part filling a gap region between the first and second holders on the substrate;
a transparent cover disposed on the first holder and the molding part; and
an adhesion part disposed between the molding part and the transparent cover,
wherein the adhesion part is in direct contact with the molding part.

11. The semiconductor package of claim 10, further comprising:
bonding wires electrically connecting the image sensor chip to the substrate on the substrate,
wherein the bonding wires do not overlap with the connection holder when viewed in plan view.

12. The semiconductor package of claim 10,
wherein the adhesion part is further disposed between the holder and the transparent cover,
wherein the adhesion part includes a photo-curable polymer or a photo/heat dual curable polymer, and
wherein the molding part includes a thermosetting polymer.

13. The semiconductor package of claim 12,
wherein a top surface of the molding part is disposed at a lower level than a top surface of the holder, and
wherein a top surface of the adhesion part disposed on the molding part is disposed at substantially the same level as a top surface of the adhesion part disposed on the first holder of the holder.

14. The semiconductor package of claim 10,
wherein a top surface of the second holder is disposed at a higher level than a top surface of the first holder and is disposed at substantially the same level as or a lower level than a top surface of the transparent cover.

15. The semiconductor package of claim 10, further comprising:
a first adhesive film disposed between the first holder and the image sensor chip; and
a second adhesive film disposed between the second holder and the substrate.

16. A semiconductor package comprising:
a substrate;
an image sensor chip mounted on the substrate;
a first holder disposed on an edge area of the image sensor chip to surround micro-lenses of the image sensor chip;
a second holder spaced apart from the image sensor chip and disposed on an edge area of the substrate to surround the image sensor chip;
a molding part disposed in a gap region between the first holder and the second holder on the substrate;
an adhesion part disposed on the first holder and the molding part; and
a transparent cover disposed on the adhesion part to form an air gap defined by a bottom surface of the transparent cover, side walls of the first holder, and a top surface of the image sensor chip,
wherein the air gap is sealed by the adhesion part, and
wherein the adhesion part is in direct contact with the molding part.

17. The semiconductor package of claim 16,
wherein a top surface of the adhesion part disposed on the first holder and a top surface of the adhesion part disposed on the molding part are at substantially a same level.

18. The semiconductor package of claim 17,
wherein a top surface of the transparent cover is disposed at a level that is substantially the same as a level of a top surface of the second holder or at a level that is different from a level of a top of the second holder; and
wherein the adhesion part is further disposed between a portion of side walls of the second holder and a sidewall of the transparent cover.

19. The semiconductor package of claim 17,
wherein the adhesion part is further disposed on the second holder, and a top surface of the first holder and a top surface of the second holder are disposed at substantially a same level.

20. The semiconductor package of claim 16, further comprises:
a connection holder to connect the first holder and the second holder,
wherein the connection holder extends in a direction diagonal to a sidewall of the image sensor chip and connects a corner of the first holder to a corner of the second holder, and
wherein the connection holder covers the sidewall of the image sensor chip and a portion of the top surface of the image sensor chip adjacent to the sidewall.

* * * * *